United States Patent [19]
Nishi

[11] Patent Number: 5,844,247
[45] Date of Patent: *Dec. 1, 1998

[54] EXPOSURE APPARATUS AND METHOD WHICH SYNCHRONOUSLY MOVES THE MASK AND THE SUBSTRATE TO MEASURE DISPLACEMENT

[75] Inventor: Kenji Nishi, Yokohama, Japan

[73] Assignee: Nikon Corporation, Tokyo, Japan

[*] Notice: The term of this patent shall not extend beyond the expiration date of Pat. No. 5,646,413.

[21] Appl. No.: 831,770

[22] Filed: Apr. 2, 1997

Related U.S. Application Data

[62] Division of Ser. No. 608,086, Feb. 28, 1996, Pat. No. 5,646,413, which is a continuation of Ser. No. 476,912, Jun. 7, 1995, abandoned, which is a continuation of Ser. No. 203,037, Feb. 28, 1994, abandoned.

[30] Foreign Application Priority Data

Feb. 26, 1993 [JP] Japan ........................... 5-38077
Dec. 28, 1993 [JP] Japan ........................... 5-334759

[51] Int. Cl.$^6$ ..................................... G01N 21/86
[52] U.S. Cl. ............................ 250/548; 356/401
[58] Field of Search ................. 250/548, 201.2; 355/43, 53, 55; 356/399–401

[56] References Cited

U.S. PATENT DOCUMENTS 5,646,413 7/1997 Nishi ........................................ 250/548

*Primary Examiner*—Stephone B. Allen
*Attorney, Agent, or Firm*—Shapiro and Shapiro

[57] ABSTRACT

There is disclosed an exposure method for transferring, using an optical system for illuminating a mask having patterns to be transferred on a substrate and a projection optical system for projecting images of the patterns to the substrate, the patterns to the substrate through the projection optical system by means of scanning the mask and the substrate synchronously relative to the projection optical system. The method comprises the steps of providing a plurality of measuring marks on the mask formed along a relative scanning direction, and providing a plurality of reference marks formed on the stage corresponding to the measuring marks, respectively, moving the mask and the substrate synchronously in the relative scanning direction to measure successively a displacement amount between the measuring marks on the mask and the reference marks, and obtaining a correspondence relation between a coordinate system on the mask and a coordinate system on the stage according to the displacement amount.

119 Claims, 19 Drawing Sheets

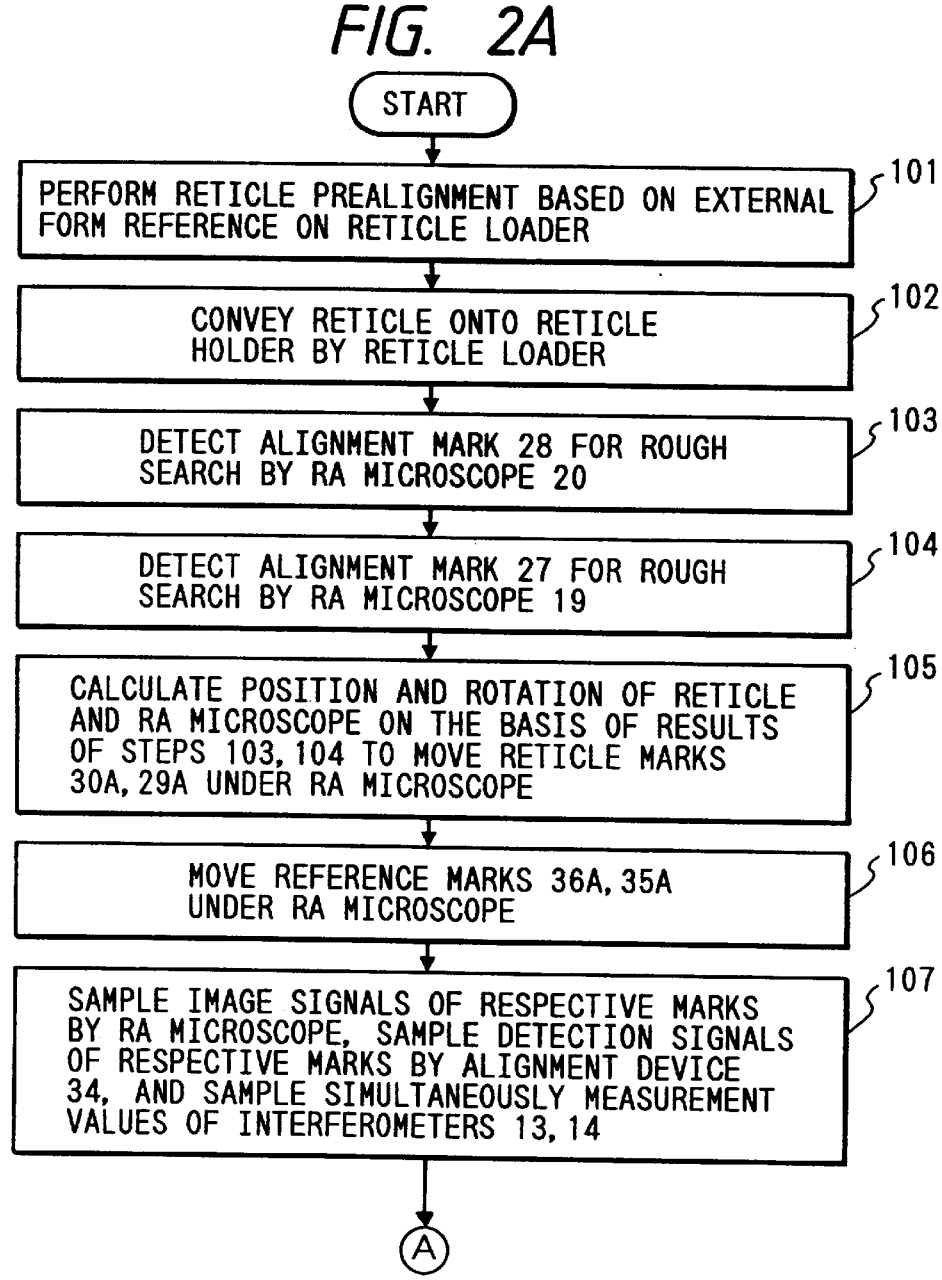

FIG. 6A
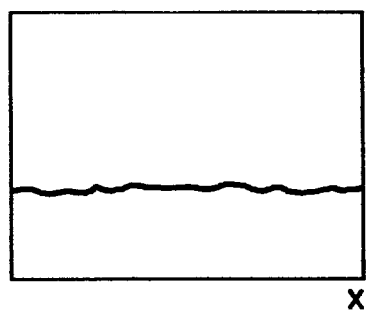
FIG. 6D
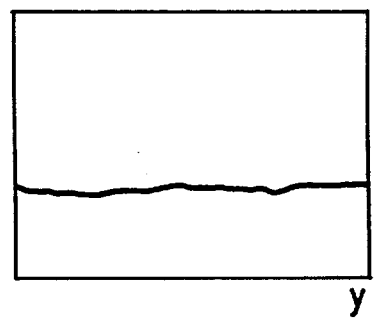
FIG. 6B
FIG. 6E
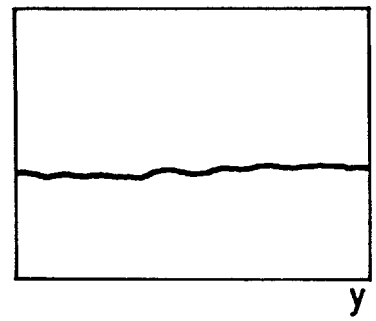
FIG. 6C
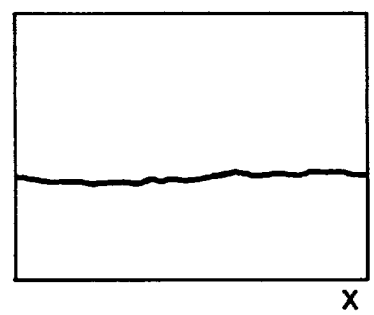
FIG. 6F
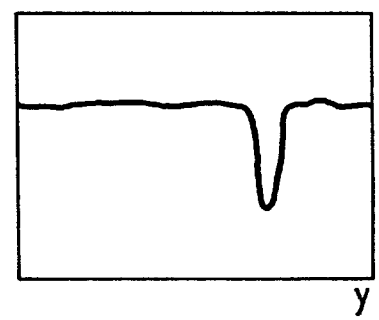
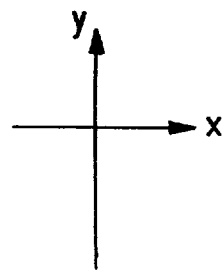
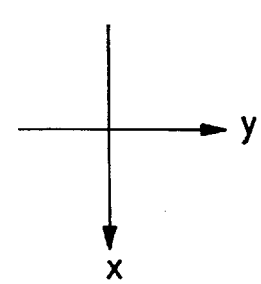

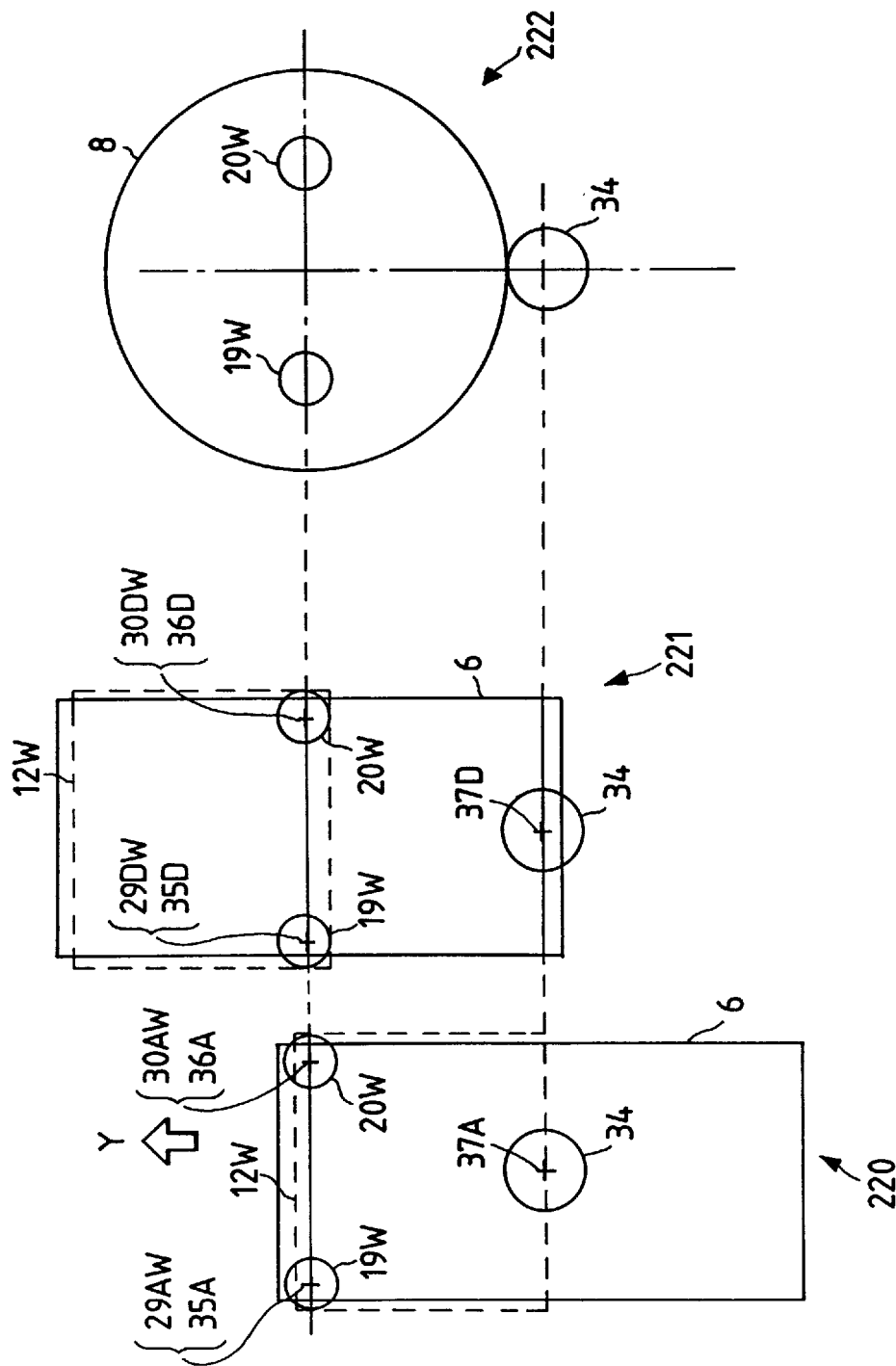

FIG. 15

| FIG. 15A |
|---|
| FIG. 15B |

FIG. 15A

START
↓
101: PERFORM RETICLE PREALIGNMENT BASED ON EXTERNAL FORM REFERENCE ON RETICLE LOADER
↓
102: CONVEY RETICLE ONTO RETICLE HOLDER BY RETICLE LOADER
↓
103: DETECT ALIGNMENT MARK 28 FOR ROUGH SEARCH BY RA MICROSCOPE 20
↓
104: DETECT ALIGNMENT MARK 27 FOR ROUGH SEARCH BY RA MICROSCOPE 19
↓
QUICK MODE ? — NO → 115, TO STEP 116
↓ YES
105: CALCULATE POSITION AND ROTATION OF RETICLE AND RA MICROSCOPE ON THE BASIS OF RESULTS OF STEPS 103, 104 TO MOVE RETICLE MARKS 30A, 29A UNDER RA MICROSCOPE
↓
106: MOVE REFERENCE MARKS 36A, 35A UNDER RA MICROSCOPE
↓
107: SAMPLE IMAGE SIGNALS OF RESPECTIVE MARKS BY RA MICROSCOPE, SAMPLE DETECTION SIGNALS OF RESPECTIVE MARKS BY ALIGNMENT DEVICE 34, AND SAMPLE SIMULTANEOUSLY MEASUREMENT VALUES OF INTERFEROMETERS 13, 14
↓
(A)

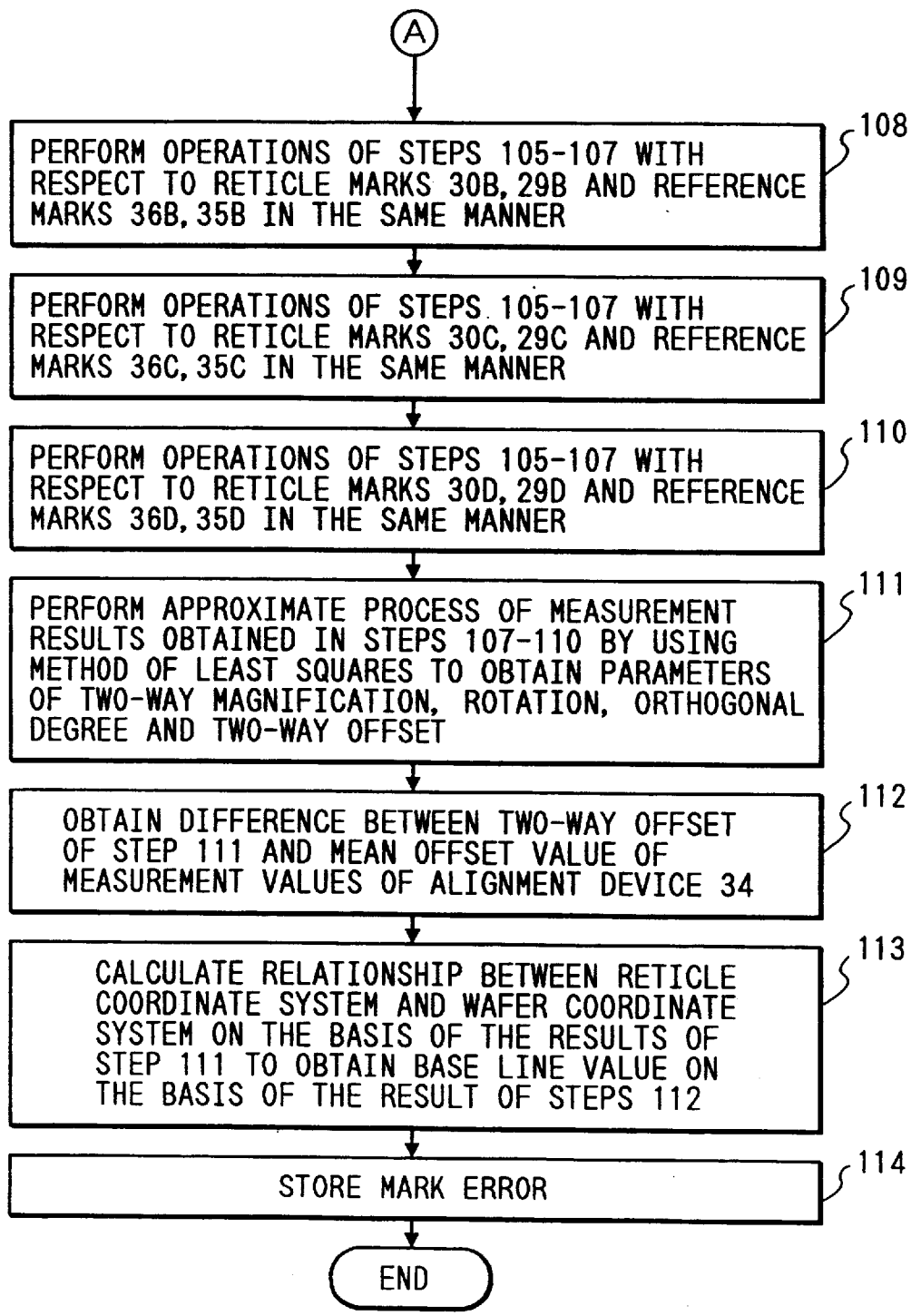

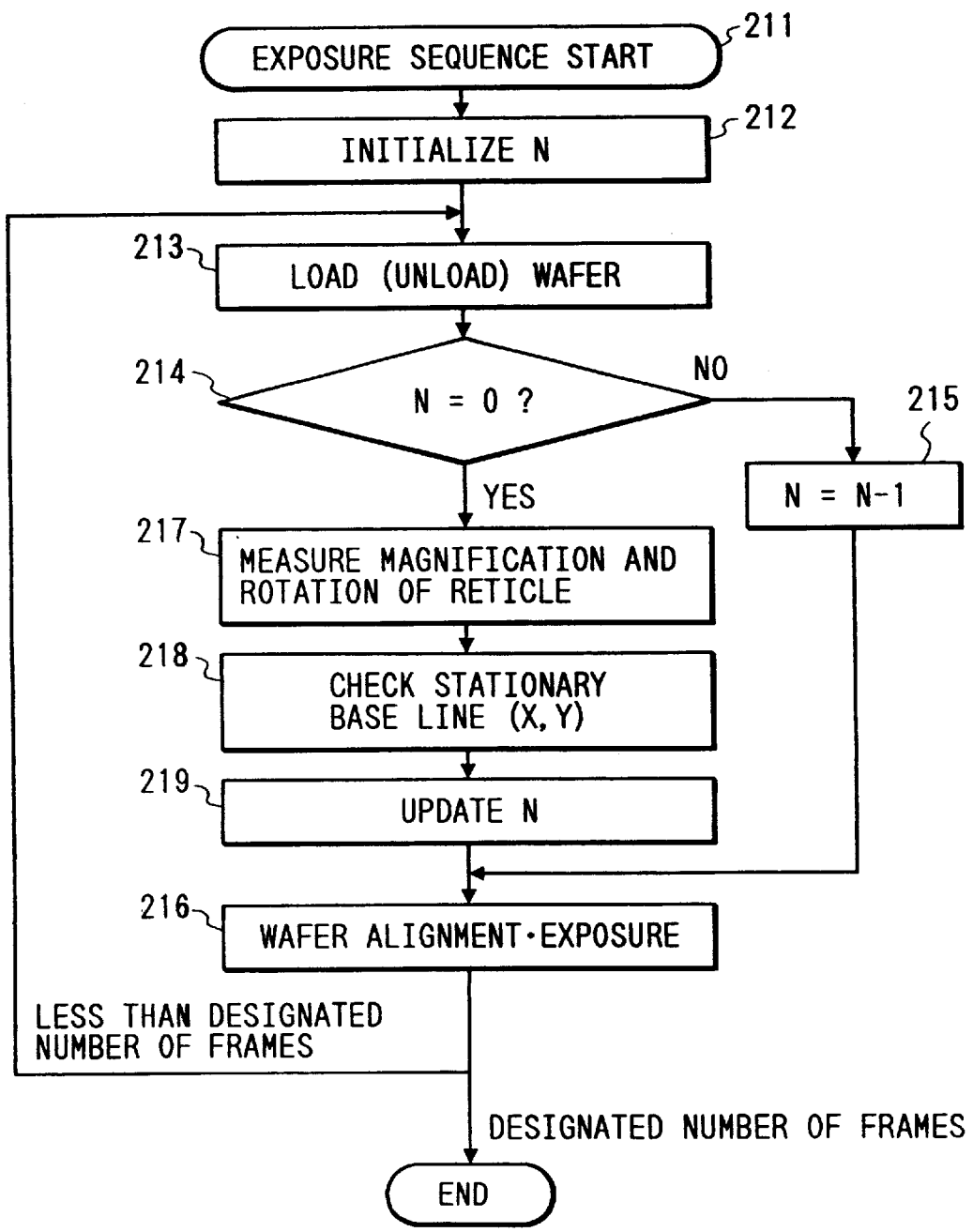

EXPOSURE APPARATUS AND METHOD WHICH SYNCHRONOUSLY MOVES THE MASK AND THE SUBSTRATE TO MEASURE DISPLACEMENT

This is a division of application Ser. No. 08/608,086 filed Feb. 28, 1996, U.S. Pat. No. 5,646,413 which is a continuation of application Ser. No. 08/476,912 filed Jun. 7, 1995 (abandoned), which is a continuation of application Ser. No. 08/203,037 filed Feb. 28, 1994 (abandoned).

BACKGROUND OF THE INVENTION

1. Field of the Invention

This invention relates to a method of exposing and an apparatus therefor. More particularly, the present invention relates to an exposure apparatus of, for example, a slit scanning exposure type and an exposure method advantageously applicable to such apparatus.

2. Related Background Art

Projection type exposure apparatus has been used in manufacturing semiconductor devices, liquid crystal displays and thin-film magnetic heads through a photolithography process, in which patterns of a photomask or a reticle (hereinafter, referred generally to as "reticle") are transferred to the surface of a substrate (wafer, glass plate, etc.) coated with a photosensitive coating.

The conventional projection type exposure apparatus commonly used is a reduction projection type exposure apparatus (stepper) that moves individual shots on the wafer successively to an exposing field of a projection optical system to reproduce pattern images of the reticle on the shots using a photographic step-and-repeat process.

In the typical steppers, a wafer coordinate system is corresponded to a reticle coordinate system (reticle alignment).

Some steppers comprise an alignment microscope of an off-axis type provided at one side surface of the projection optical system to detect a position of the alignment mark (wafer mark) formed as a correspondence to each shot on the wafer. In such a case, the shot on the wafer is determined within the exposing field of the projection optical system according to the position of the associated wafer mark detected on the alignment microscope. Accordingly, so-called base line amount should be obtained previously that represents a distance between a reference point (such as an exposure center) within the exposing field of the projection optical system and a reference point in an observing field of the alignment microscope of the off-axis type.

The reticle alignment and the base line measurement are disclosed in detail in, for example, Japanese Patent Application Laid-Open No. 4-324923 (corresponding to U.S. patent application Ser. No. 872,750 (filed on Apr. 21, 1992)).

In recent years, fine patterns for the semiconductor devices require resolution of the projection optical system to be improved. To improve the resolution, exposing light may be shifted to a shorter wavelength or alternatively, the number of openings of the projection optical system may be increased. In any event, it has been difficult to maintain an image quality (such as distortion and image plate deformation) on the entire exposing field with a predetermined accuracy when it is intended to ensure as same exposing field as conventional arts. With this respect, the projection type exposure apparatuses based on so-called slit scanning exposure type have taken a favorable turn.

In the projection type exposure apparatus of the slit scanning exposure type, the reticle and the wafer are scanned relative to and synchronous with a rectangular or arc-shaped illumination field (hereinafter, referred to as a "slit-shaped illumination field") to transfer the patterns of the reticle on the wafer. The slit scanning exposure type thus makes it possible to reduce the exposing field of the projection optical system as compared with the stepper type, provided that the reproduced patterns are equal in area to those reproduced using the stepper type. This may improve the accuracy of the image quality within the exposing field. A six-inch size is dominant for the conventional reticles while a one-fifth factor is dominant as the projection magnification of the projection optical system. At the magnification of one-fifth factor, the six-inch reticle may sometimes be insufficient for recent circuit patterns of the semiconductor device having the increased area. As a result, the projection optical systems should so designed that the projection magnification of the projection optical system is changed to, for example, quarter factors. To comply with requirements for such reproduced patterns having the increased area, the slit scanning exposure type can advantageously be applied.

In this event, the alignment method based on the reticle and wafer coordinate systems used in the conventional steppers may be unfavorable when being applied to the projection type exposure apparatus of the slit scanning type. The projection magnification of quarter factors adversely affects the accuracy of the alignment because the alignment becomes more sensitive to writing errors of the circuit patterns on the reticle.

A technique has been suggested in the above mentioned U.S. patent application Ser. No. 872,750 (filed on Apr. 21, 1992) to measure a rotation angle of the reticle by means of measuring simultaneously the amount of displacement of two or more measuring marks rather than moving the wafer stages in the wafer. However, the idea of measuring the rotation angle using the simultaneous measuring of the measuring marks cannot be applied to scanning directions of the projection type exposure apparatus of the slit scanning exposure type. Thus, there is a disadvantage that it is impossible to measure the rotation angle of the reticle and wafer coordinate systems and orthogonal amount of the coordinates of these coordinate systems.

As for the method of measuring the base line amount between the reference position within the exposing field of the projection optical system and the reference position of the alignment system of the off-axis type, the conventional measuring method using a pair or marks on the reticle in the stepper is disadvantageous, when it is applied to the projection type exposure apparatus of the slit scanning exposure type with no modification, in that the writing error of the reticle significantly affects the measurements.

SUMMARY OF THE INVENTION

With respect to these problems, the present invention is directed to provide an exposure method and an exposure apparatus capable of reducing affect of the writing error between the patterns on the reticle (mask), allowing positive alignment of the reticle coordinate system (mask coordinate system) and the wafer coordinate system (substrate coordinate system) in the exposure apparatus of the slit scanning exposure type.

In light of this, speed of operation may sometimes be considered to be more important than the accuracy of alignment depending on the process. With this respect, another object of the present invention is to provide an exposure method and an exposure apparatus capable of aligning the reticle coordinate system (mask coordinate system) with the wafer coordinate system (substrate coordinate system) at a higher throughput.

Yet another object of the present invention is to provide an exposure method and an exposure apparatus capable of reducing affect of the writing error between the patterns on the reticle (mask), allowing positive measurement of the base line amount between the reference point in the exposing field of the projection optical system and the reference point of the alignment system in the exposure apparatus of the slit scanning exposure type.

Still another object of the present invention is to provide an exposure method and an exposure apparatus in which the alignment between the reticle coordinate system (mask coordinate system) and the wafer coordinate system (substrate coordinate system) as well as the base line amount are obtained for exposure.

In a case where the base line measurement is performed for every predetermined number of wafer replacements, speed of operation may be considered to be more important than the accuracy of alignment. At the same time, the reticle coordinate system (mask coordinate system) is preferably aligned to the wafer coordinate system (substrate coordinate system). With this respect, another object of the present invention is to provide an exposure method and an exposure apparatus capable of aligning the reticle coordinate system (mask coordinate system) to the wafer coordinate system (substrate coordinate system) and of measuring the base line therefor at a higher throughput for every predetermined number of wafer replacements.

It is yet another object of the present invention to provide an exposure method and an exposure apparatus using a plurality of measuring reticle marks to reduce affect of, for example, the writing errors between patterns on the reticle (mask).

It is still another object of the present invention to provide an exposure method and an exposure apparatus capable of aligning the reticle coordinate system (mask coordinate system) to the wafer coordinate system (substrate coordinate system) and of measuring the base line therefor with a high accuracy in consideration of an error component to a relative scanning direction of the mask to the wafer.

In an exposure method according to a first aspect of the present invention, it is provided with an exposure method of transferring, using an optical system for illuminating a mask having patterns to be transferred to a substrate and a projection optical system for projecting images of the patterns to the substrate, the patterns on the mask to the substrate on a stage through the projection optical system by means of scanning the mask and the substrate synchronously relative to the projection optical system, wherein the method comprises the steps of: providing a plurality of measuring marks on the mask formed along a relative scanning direction, and providing a plurality of reference marks formed on the stage corresponding to the measuring marks, respectively; moving the mask and the substrate synchronously in the relative scanning direction to measure successively a displacement amount between the measuring marks on the mask and the reference marks; and obtaining a correspondence relation between a coordinate system on the mask and a coordinate system on the stage according to the displacement amount.

In an exposure method according to a second aspect of the present invention, it is provided with an exposure method of transferring, using an exposure apparatus having an optical system for illuminating a mask having patterns to be transferred to a substrate, a mask stage for holding the mask, a substrate stage for holding the substrate, a projection optical system for projecting images of the patterns to the substrate, and an alignment system having its detection center at a position away from the optical axis of the projection optical system at a predetermined distance, the patterns to the substrate through the projection optical system by means of scanning the mask and the substrate synchronously relative to the projection optical system, wherein the method comprises the steps of providing a plurality of measuring marks formed on the mask along a relative scanning direction; providing first reference marks corresponding to a part of the measuring marks and second reference marks corresponding to the first reference marks, respectively, the first and the second reference marks being formed on the stage, the second reference marks being away from the first reference marks at a given distance that is recognized previously; moving the mask to the relative scanning direction with the second reference marks observed through the alignment system to measure successively a displacement amount between the measuring marks on the mask and the first reference marks; and obtaining a distance between a reference point within an exposing field of the projection optical system and the detection center according to the displacement amount between the measuring marks and the first reference marks, to a displacement amount of the second reference marks observed through the alignment system, and to the given distance previously recognized.

In an exposure method according to a third aspect of the present invention, it is provided with an exposure method of transferring, using an exposure apparatus having an optical system for illuminating a mask having patterns to be transferred to a substrate, a mask stage for holding the mask, a substrate stage for holding the substrate, a projection optical system for projecting images of the patterns to the substrate, and an alignment system having its detection center at a position away from the optical axis of the projection optical system at a predetermined distance, the patterns to the substrate through the projection optical system by means of scanning the mask and the substrate synchronously relative to the projection optical system, wherein the method comprises the steps of providing a plurality of measuring marks formed on the mask along a relative scanning direction; providing first reference marks corresponding to each of the measuring marks and second reference marks corresponding to the first reference marks, respectively, the first and the second reference marks being formed on the stage, the second reference marks being away from the first reference marks at a given distance that is recognized previously; moving the mask and the substrate to a scanning direction to measure successively a displacement amount between the measuring marks on the mask and the first reference marks; moving the mask and the substrate relatively to the scanning direction to measure successively a displacement amount of the second reference marks; and obtaining a distance between a reference point within an exposing field of the projection optical system and the detection center according to the displacement amount between the measuring marks and the first reference marks, to a displacement amount of the second reference marks observed through the alignment system, and to the given distance previously recognized.

In an exposure method according to a fourth aspect of the present invention, it is provided with an exposure method of transferring, by means of illuminating an illumination area of a predetermined shape using an illumination light to scan a mask and a substrate synchronously relative to the illumination area of a predetermined shape, patterns on the mask within the illumination area of the predetermined shape through a projection optical system to the substrate on a stage, wherein the method comprises, with a plurality of measuring marks formed on the mask along a relative scanning direction and reference marks formed on the stage corresponding to the measuring marks, a first step for measuring a displacement amount between a part of the measuring marks and the reference marks corresponding to the part of the measuring marks, respectively; a second step for moving the mask and the substrate synchronously to the relative scanning direction to measure successively a displacement amount between the measuring marks on the mask and the reference marks corresponding to the measuring marks; and a third step for selecting one of the first and the second steps to obtain a corresponding relation between a coordinate system on the mask and a coordinate system on the stage according to the displacement amount between the measuring marks and the reference marks, respectively, obtained at the selected step.

In an exposure method according to a fifth aspect of the present invention, it is provided with an exposure method of transferring, using an exposure apparatus having an optical system for illuminating an illumination area of a predetermined shape using an illumination light, a mask stage for holding a mask provided with patterns to be exposed, a substrate stage for holding a substrate, a projection optical system for projecting the patterns on the mask to the substrate, an alignment system having its detection center at a position away from the optical axis of the projection optical system at a predetermined position, the patterns on the mask in the illumination area of the predetermined shape through the projection optical system to the substrate by means of scanning the mask and the substrate synchronously relative to the illumination area of the predetermined shape, wherein the method comprises, with a plurality of measuring marks formed on the mask along a relative scanning direction and a plurality of first reference marks corresponding to the measuring marks and second reference marks corresponding to the first reference marks, the first and the second reference marks being formed on the stage, the second reference marks being away from the first reference mark at a given distance that is recognized previously, a first step for measuring a displacement amount between a part of the measuring marks on the mask and the first reference marks corresponding to the part of the measuring marks, respectively, and measuring a displacement amount between the second reference marks corresponding to the part of the first reference mark; a second step for moving the mask and the substrate in synchronism with the scanning direction to measure successively a displacement amount between the measuring marks and the first reference marks corresponding to the measuring marks, respectively, and a displacement amount of the second reference marks; a third step for selecting one of the first and the second step; and a fourth step for obtaining a corresponding relation between a coordinate system on the mask stage and a coordinate system on the substrate stage and a distance between a reference point within an exposing field of the projection optical system and the detection center according to information obtained during the step selected at the third step and a given distance previously recognized.

In an exposure method according to a sixth aspect of the present invention, it is provided with an exposure method of transferring, using an exposure apparatus having an optical system for illuminating an illumination area of a predetermined shape using an illumination light, a mask stage for holding a mask provided with patterns to be exposed, a substrate stage for holding a substrate, a projection optical system for projecting the patterns on the mask to the substrate, an alignment system having its detection center at a position away from the optical axis of the projection optical system at a predetermined position, the patterns on the mask in the illumination area of the predetermined shape through the projection optical system to the substrate by means of scanning the mask and the substrate synchronously relative to the illumination area of the predetermined shape, wherein the method comprises, with a plurality of measuring marks formed on the mask along a relative scanning direction and a plurality of first reference marks corresponding to the measuring marks and second reference marks corresponding to the first reference marks, the first and the second reference marks being formed on the stage, the second reference marks being away from the first reference mark at a given distance that is recognized previously, for every replacement of predetermined number of substrates, a step for measuring a displacement amount between a part of the measuring marks on the mask and the first reference marks corresponding to the part of the measuring marks, respectively, and measuring a displacement amount between the second reference marks corresponding to the part of the first reference mark; and a step for obtaining a corresponding relation between a coordinate system on the mask and a coordinate system on the stage and a distance between a reference point within an exposing field of the projection optical system and the detection center according to a displacement amount between one measuring mark and one first reference mark, to a displacement amount of the second reference marks, and to the given distance recognized previously.

According to the first exposure method of this invention, it is possible to reduce affect of the writing error of the measuring marks on the mask by means of obtaining a parameter (such as the magnification, a scaling in the scanning direction, rotation, degree of parallelism in the scanning direction, and offsets in an X direction and a Y direction) for use in aligning the mask coordinate system with the substrate coordinate system by using the least square approximation by means of, finally, matching the displacement obtained, for example, at each position of the measuring mark on the mark.

According to the second exposure method, it is possible to measure positively the base line amount or the distance between the reference point of the projection optical system and the reference point of the alignment system by means of reducing the writing error of the measuring marks on the mask through measurement regarding to the measuring marks on the mask side.

According to the third exposure method, a plurality of first reference marks are formed on a reference mark member with being correspondent with the measuring marks, respectively, on the mask. In addition, a plurality of second reference marks are formed at such a distance that corresponds to the distance between the reference point within the exposing field of the projection optical system and the reference point of the alignment system from the first reference marks. Accordingly, the base line amount can be measured more positively because the balancing is made across the reference marks.

According to the fourth exposure method, simple measuring steps based on a quick mode are selected, which allows calculation of the corresponding relation between the coordinate system on the mask and the coordinate system on the stage at a higher throughput depending on the necessities.

According to the fifth exposure method, simple measuring steps based on a quick mode are selected, which allows calculation of the corresponding relation between the coordinate system on the mask and the coordinate system on the stage as well as the base line amount at a higher throughput depending on the necessities.

According to the sixth exposure method, simple measuring steps based on a quick mode are performed for every exposure of a predetermined number of substrates, which allows calculation of the corresponding relation between the coordinate system on the mask and the coordinate system on the stage as well as the base line amount at a higher throughput when many substrates are subjected to exposure continuously through the scanning method.

In an exposure method according to a seventh aspect of the present invention, it is provided with an exposure method for transferring, by means of illuminating an illumination area of a predetermined shape using an illumination light and scanning a mask and a substrate synchronously relative to the illumination area of the predetermined shape, patterns on the mask in the illumination area of the predetermined shape to the substrate on a stage through a projection optical system, wherein the method comprises, with a plurality of measuring marks formed on the mask along a relative scanning direction and a plurality of reference marks formed on the stage corresponding to a part of the measuring marks, the steps of moving the mask to the relative scanning direction to measure successively a displacement amount between the measuring marks on the mask and the reference marks; and obtaining a corresponding relation between a coordinate system on the mask and a coordinate system on the stage.

In an exposure method according to an eighth aspect of the present invention, it is provided with an exposure method for transferring, using an exposure apparatus having an optical system for illuminating an illumination area of a predetermined shape using an illumination light, a mask stage for holding a mask provided with patterns to be exposed, a substrate stage for holding a substrate, a projection optical system for projecting the patterns on the mask to the substrate, an alignment system having its detection center at a position away from the optical axis of the projection optical system at a predetermined position, the patterns on the mask in the illumination area of the predetermined shape through the projection optical system to the substrate by means of scanning the mask and the substrate synchronously relative to the illumination area of the predetermined shape, wherein the method comprises the steps of forming on the substrate stage a reference mark detectable by the alignment system to measure a displacement amount of the reference marks by the alignment system; entering a mark error of the mask; and obtaining a corresponding relation between a coordinate system on the mask stage and a coordinate system on the substrate stage, and a distance between a reference pint within an exposing field of the projection optical system and the detection center.

In an exposure apparatus according to a first aspect of the present invention, it is provided with an exposure apparatus comprising a mask stage for holding a mask provided with patterns to be transferred; a substrate stage for holding a substrate; an optical system for illuminating the mask using an illumination light; a projection optical system for projecting images of the patterns on the mask to the substrate; and a first mark detecting system for detecting a mask mark formed at a predetermined position on the mask within an exposing field of the projection optical system, the exposure apparatus being for use in scanning the mask and the substrate synchronously relative to the projection optical system to transfer the patterns on the mask to the substrate through the projection optical system, wherein the apparatus further comprises a reference plate provided on the substrate stage, the reference plate comprising a plurality of first reference marks detectable by the first mark detecting system through the projection optical system; a plurality of measuring marks provided on the mask, each of the measuring marks being provided along a relative scanning direction with being correspondent with the reference mark; a driving control system for use in observing a part of the first reference marks and a part of the measuring marks through the first mark detecting system to move the mask stage and the substrate stage to the relative scanning direction such that a displacement amount between the measuring marks on the mask and the reference marks is measured successively; and calculating means for calculating a corresponding relation between a coordinate system on the mask stage and a coordinate system on the substrate stage.

In an exposure apparatus according to a second aspect of the present invention, it is provided with an exposure apparatus comprising a mask stage for holding a mask provided with patterns to be transferred; a substrate stage for holding a substrate; an optical system for illuminating the mask using an illumination light; a projection optical system for projecting images of the patterns on the mask to the substrate; and a first mark detecting system for detecting a mask mark formed at a predetermined position on the mask within an exposing field of the projection optical system, the apparatus being for use in scanning the mask and the substrate synchronously relative to the projection optical system to transfer the patterns on the mask to the substrate through the projection optical system, wherein the apparatus further comprises a reference plate provided on the substrate stage, the reference plate comprising a plurality of first reference marks detectable by the first mark detecting system through the projection system and second reference marks provided with being away from the first reference marks at a given distance that is recognized previously; a plurality of measuring marks provided on the mask, each of the measuring mask being provided along the relative scanning direction with being correspondent with the first reference mark; a driving control system for use in moving the mask stage and the substrate stage to the relative scanning direction such that the part of the measuring marks and the part of the reference marks are observed through the first mark detecting system and a displace amounts are measured successively between the measuring marks on the mask and the reference marks as well as between the second reference marks with one of a plurality of second reference marks being observed through a second mark detecting system; and calculating means for calculating a corresponding relation between a coordinate system on the mask stage and a coordinate system on the substrate stage and a distance between a reference point within an exposing field of the projection optical system and the detection center according to the displacement amounts measured.

BRIEF DESCRIPTION OF THE DRAWINGS

FIGS. 6A, 6B, 6C, 6D, 6E and 6F are views showing waveforms of image pick-up signals supplied from an image pick-up device during a rough alignment of the reticle;

FIG. 8D is an enlarged view showing an example of a reference mark 35A or the like;

FIG. 8E is a plan view showing an example of a reference mark 37A or the like;

FIG. 9 is a plan view for use in describing relation among the reference mark plate, the reticle, the projection optical system and the alignment device during measurement of reticle alignment and a base line amount;

FIG. 15 is comprised of FIGS. 15A and 15B showing flow charts illustrating a part of operation of an exposure method and a base line amount check method according to a second embodiment;

FIG. 17 is a flow chart illustrating operation of an exposure method according to a third embodiment.

DESCRIPTION OF THE PREFERRED EMBODIMENTS

A projection exposure method according to a first embodiment of the present invention is now described with reference to the drawings. This embodiment is when the present invention is applied to a case where patterns on the reticle are exposed on a wafer by using a projection type exposure apparatus of a slit scanning exposure type.

Figure 1:
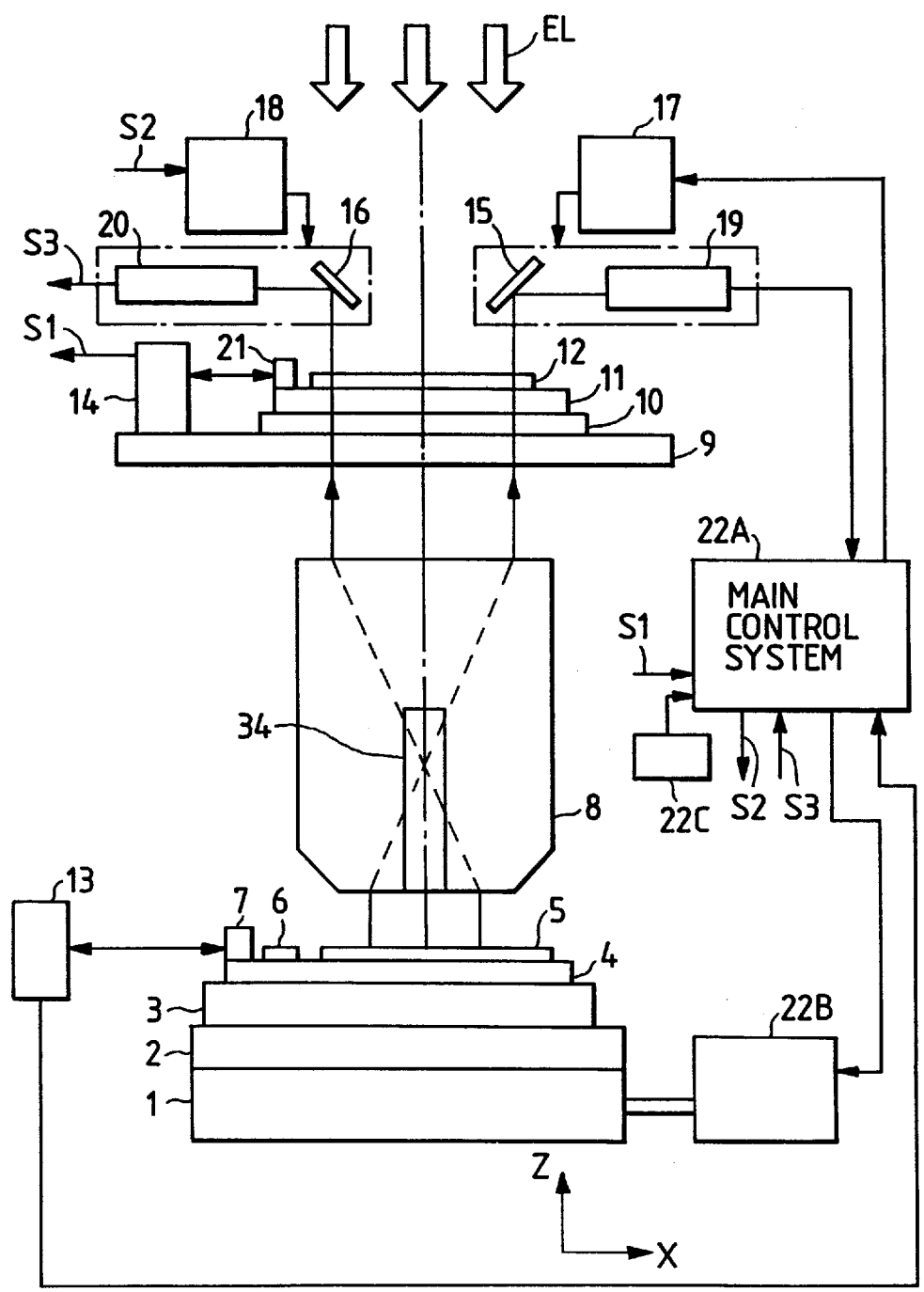
FIG. 1 is a structural diagram showing a projection type exposure apparatus to which an embodiment of a projection exposure method according to the present invention is applicable.

FIG. 1 shows a projection type exposure apparatus according to this embodiment. In FIG. 1, patterns on a reticle 12 are illuminated through an illumination area (hereinafter, referred to as a "slit-shaped illumination area") of a rectangular shape formed by an exposing light EL from an illuminating optical system which is not shown in the figure. Images of the patterns are projected and exposed on a wafer 5 through a projection optical system 8. In this event, the wafer 5 is scanned backward from the perspective to the surface of FIG. 1 at a constant velocity V/M (where 1/M is a reduction magnification of the projection optical system 8) in synchronism with the scanning of the reticle 12 forward from the perspective of the surface of FIG. 1 at the constant velocity of V relative to the slit-shaped illumination area of the exposing light EL.

Described is a driving system for the reticle 12 and the wafer 5. A reticle Y-driving stage 10 is mounted on a reticle supporting platform 9. The reticle Y-driving stage 10 is drivable in a direction of a Y axis (a direction perpendicular to the paper surface of FIG. 1). A reticle fine driving stage 11 is mounted on the reticle Y-direction driving stage 10. The reticle 12 is held by a vacuum chuck or the like on the reticle fine driving stage 11. The reticle fine driving stage 11 controls a position of the reticle 12 slightly with a high accuracy in an X direction parallel to the paper surface of FIG. 1, Y direction and a rotation direction (θ direction) within a plane orthogonal to the optical axis of the projection optical system 8. A movable mirror 21 is disposed on the reticle fine driving stage 11. Positions of the reticle fine driving stage 11 are monitored continuously in the X, Y and θ directions through an interferometer 14 disposed on the reticle supporting platform 9. Position information S1 obtained by the interferometer 14 is supplied to a main control system 22A.

A wafer Y-axis driving stage 2 is mounted on a wafer supporting platform 1. The wafer Y-axis driving stage 2 is drivable in a direction of the Y-axis. A wafer X-axis driving stage 3 is mounted on the wafer Y-axis driving stage 2. The wafer X-axis driving stage 3 is drivable in a direction of an X-axis. A Zθ-axis driving stage 4 is so disposed on the wafer X-axis driving state 3 that is drivable in at least the rotation direction. The wafer 5 is held on the Zθ-axis driving stage 4 by vacuum. A movable mirror 7 is secured to the Zθ-axis driving stage 4. Positions of the Zθ-axis driving stage 4 are monitored in the X, Y and θ directions through an interferometer 13 arranged outside. Position information obtained by the interferometer 13 is also supplied to the main control system 22A. The main control system 22A controls positioning operation, through a wafer driving device 22B or the like, the wafer Y-axis driving stage 2, the wafer X-axis driving stage 3 and the Zθ-axis driving stage 4 and controls the operation of the entire device.

As will be described later, a reference mark plate 6 is secured to the surface of the Zθ-axis driving stage 4 at a position close to the wafer 5 to align a wafer coordinate system and a reticle coordinate system. The wafer coordinate system is defined by a coordinate measured by the interferometer 13 at the wafer side. The reticle coordinate system is defined by a coordinate measured by the interferometer 14 at the reticle side. Various reference marks are formed on the reference mark plate 6 as will be described later. Some of these reference marks (luminous reference marks) are illuminated from the backside (from the side of the Zθ-axis driving stage 4) by an illumination light led to the Xθ-axis driving stage 4 side.

Reticle alignment microscopes 19 and 20 are provided over the reticle 12 of this embodiment to observe the reference marks on the reference mark plate 6 and the marks on the reticle 12 simultaneously. In such a case, deflection mirrors 15 and 16 are movably disposed to lead the detection light supplied from the reticle 12 to the reticle alignment microscopes 19 and 20, respectively. When an alignment sequence begins, the deflection mirrors 15 and 16 are withdrawn by mirror driving devices 17 and 18 in response to a command supplied from the main control system 22A. An alignment device 34 of the off-axis type is also provided at a Y-direction side of the projection optical system 8 to observe the alignment marks (wafer marks) on the wafer 5.

A keyboard 22C is connected to the main control system 22A, allowing an operator to enter commands. The projection aligner according to this embodiment has a quick mode for measuring quickly the base line amount or the like along with a mode for measuring the same with a high accuracy as will be described below. An operator indicates that the mode to be executed is whether the high accuracy mode or the quick mode through the keyboard 22C to the main control system 22A.

Figure 2B:
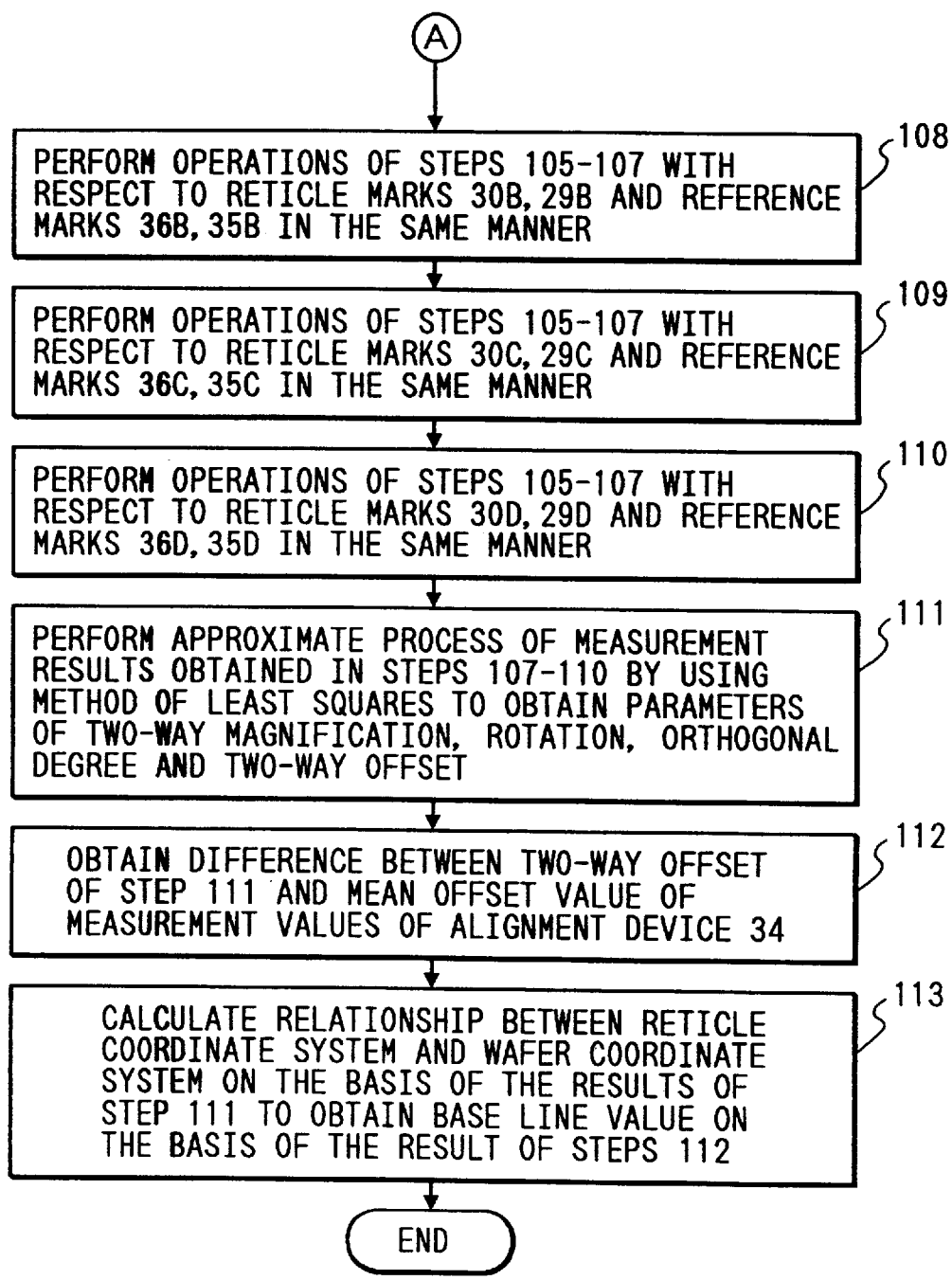
FIG. 2 is comprised of FIGS. 2A and 2B showing flow charts illustrating an exposure method and a base line amount check method according to a first embodiment of the present invention.

Next, described with reference to flow charts in FIGS. 2A and 2B is an operational sequence from loading to the wafer 5 and reticle 12 to completion of the alignment in the projection type exposure apparatus according to this embodiment. First, at step 101 in FIG. 2A, reticle 12 is subjected to prealignment based on external form reference on a reticle loader (described below).

Figure 3:
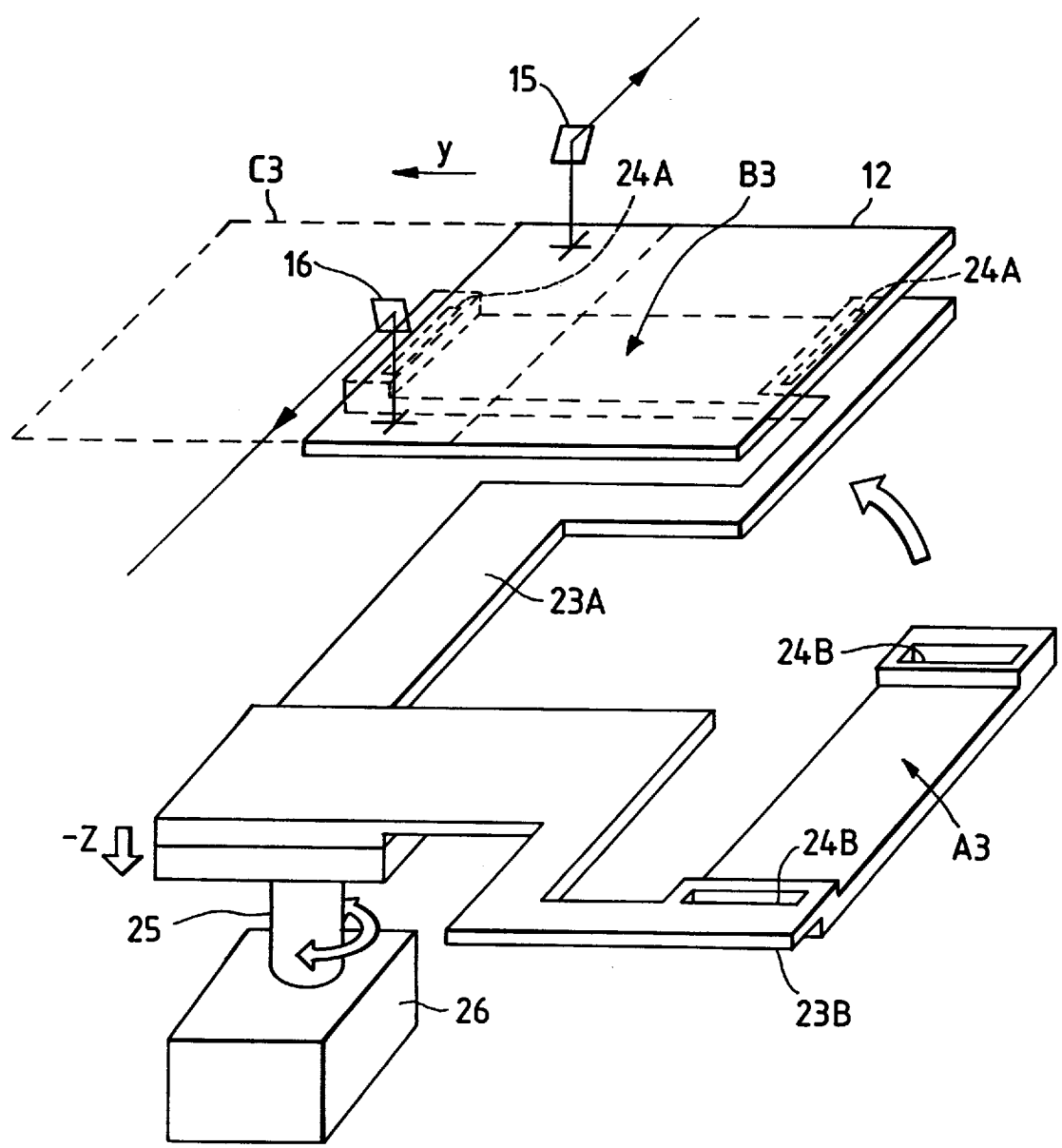
FIG. 3 is a perspective view showing a reticle loader system.

FIG. 3 shows a reticle loader system for use in carrying the reticle 12 to the reticle fine driving stage 11 shown in FIG. 1. The reticle loader in FIG. 3 comprises two reticle arms 23A and 23B, an arm rotation axis 25 connected to the reticle arms 23A and 23B, and a rotation mechanism 26 for rotating the arm rotation axis 25. Grooves 24A and 24B for vacuuming are formed in a reticle mounting surface of the reticle arms 23A and 23B, respectively. The reticle arms 23A and 23B are so supported that they can rotate independently of each other through the arm rotation axis 25.

During loading of the reticle 12, the reticle 12 is passed to the reticle arm 23A through a reticle carrying mechanism (not shown) at a position A3. At that time, the other reticle arm 23B is used for carrying, for example, another reticle used during a previous process. A reticle configuration prealignment mechanism (not shown) mounted near the position A3 aligns the reticle 12 on the reticle arm 23A based on the external form thereof with a predetermined accuracy. Subsequently, the reticle 12 is subjected to vacuum suction to the reticle arm 23A. Next, at step 102 in FIG. 2A, the rotation mechanism 26 rotates the reticle arm 23A through the arm rotation axis 25 to move the reticle 12 to a position B3 in the Y direction (a ready position (passing position) of the reticle driving stage 10 in FIG. 1).

In this event, the groove 24A for vacuum suction is a groove extending in a direction orthogonal to a suction position (parallel direction of the groove 24A) on the reticle fine driving stage 11 and is located out of a pattern area of the reticle 12. Accordingly, the reticle arm 23A is allowed to advance and retract the reticle 12 freely to and from the reticle fine driving stage 11 with the reticle fine driving stage 11 moved to the topmost in the y direction or the scanning direction. When the reticle 12 arrives over the reticle fine driving stage 11 (FIG. 1), the arm rotation axis 25 retracts in a –Z direction. The reticle 12 is thus mounted on the vacuum suction surface of the reticle fine driving stage 11. After completion of passing of the reticle 12, the reticle arm 23A is withdrawn. Subsequently, the reticle fine driving stage 11 carries the reticle 12 towards a position C3. In this event, the reticle arms 23A and 23B are driven independently of each other. The reticle passing speed is increased by means of simultaneously performing loading and unloading of the reticles by these arms.

Next, at steps following step 103 the reticle 12 is aligned. A mechanism and operation therefor are described.

Figure 4A:
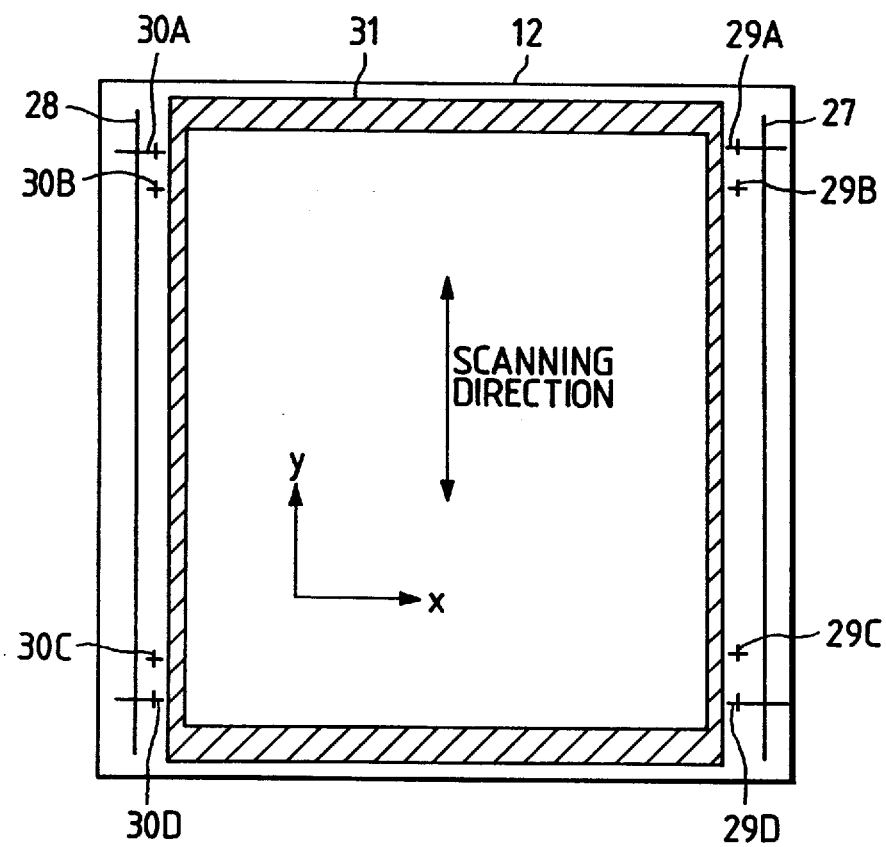
FIG. 4A is a view for use in describing an arrangement of alignment marks on a reticle.
Figure 4B:
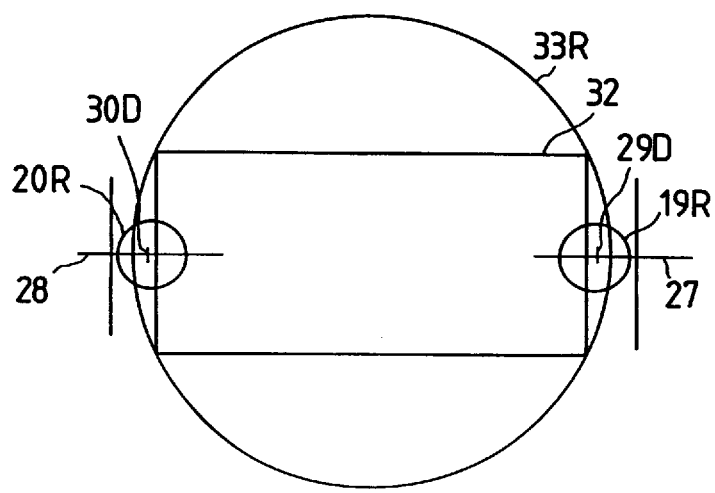
FIG. 4B is a view for use in describing an arrangement of alignment marks or the like in an area conjugated with an effective field of a projection optical system.

FIG. 4A shows arrangement of alignment marks (reticle marks) on the reticle 12. FIG. 4B shows a slit-shaped illumination area 32 or the like within an area 33R conjugated with an effective exposing field of the projection optical system over the reticle. A y direction corresponds to a scanning direction while an x direction corresponds to a direction orthogonal to the y direction. In FIG. 4A, a shield portion 31 is formed along a periphery of a pattern area at the center of the reticle 12. Reticle marks formed outside the shield portion 31 are: rough searching alignment marks 27 and 28 and fine alignment marks 29A, 29B, 29C, 29D, 30A, 30B, 30C and 30D. The rough searching alignment mark 27 at the right-hand side is formed of an elongated linear pattern and cross patterns. The linear pattern extends along the y direction or the scanning direction and the cross patterns are formed at both ends of the linear pattern. The searching alignment mark 28 at the left-hand side is formed symmetrically with the rough searching alignment mark 27 at the right-hand side.

Figure 4C:
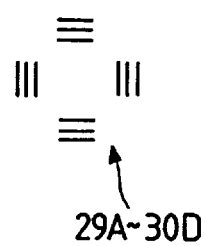
FIG. 4C is an enlarged view of fine alignment marks 29A, 29B, 29C, 29D, 30A, 30B, 30C and 30D.

The fine alignment marks 29A and 29B are provided near the y direction between the shield portion 31 at the right-hand side and one cross pattern of the rough searching alignment mark 27. The fine alignment marks 29C and 29D are provided near the y direction between the shield portion 31 at the right-hand side and the other cross pattern of the rough searching alignment mark 27. The fine alignment marks 30A, 30B, 30C and 30D are formed at the left-hand side symmetrically with the fine alignment marks 29A, 29B, 29C and 29D, respectively. While each of the fine alignment marks 29A, 29B, 29C, 29D, 30A, 30B, 30C and 30D is shown as a cross mark in FIG. 4A, it is formed of two sets of three linear patterns arranged in the x direction at a predetermined distance and two sets of three linear patterns arranged in the y direction at a predetermined distance as shown in FIG. 4C. At step 103 in FIG. 2A, the rough searching alignment mark 28 at the left-hand side in FIG. 4A is detected by the reticle alignment microscope (hereinafter referred to as "RA microscope") 20. FIG. 4B shows observation areas 19R and 20R of the RA microscopes 19 and 20, respectively, on the reticle 12. During rough searching, the rough searching alignment marks 27 and 28 are located out of the observation areas 19R and 20R and also out of an area 33R conjugated with the effective exposing field. This is because the rough searching alignment marks 27 and 28 should be large enough for rough searching but the exposing field of the projection optical system is not so large, otherwise the diameter of a projection lens should be increased, resulting in increase of the costs. With this respect, procedures for performing the rough search in this embodiment is described in conjunction with FIGS. 5A and 5B.

Figure 5A:
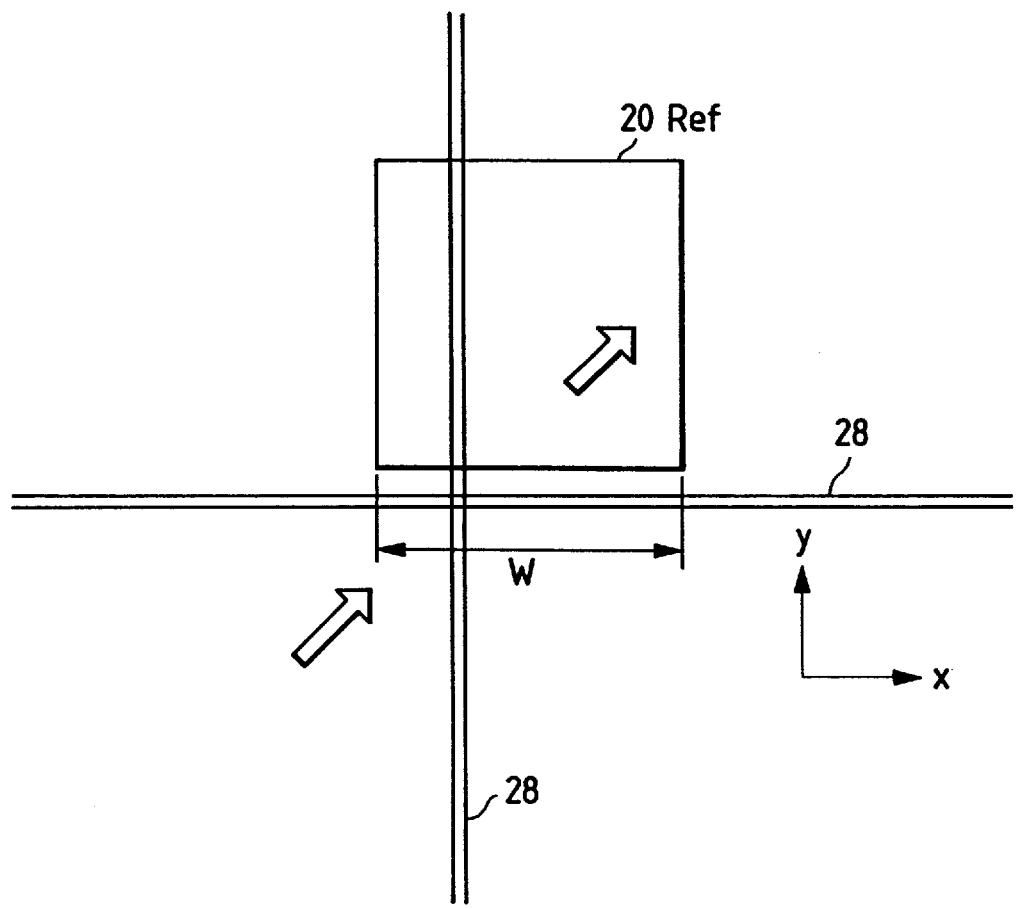
FIG. 5A is a view for use in describing how to align a reticle roughly.
Figure 5B:
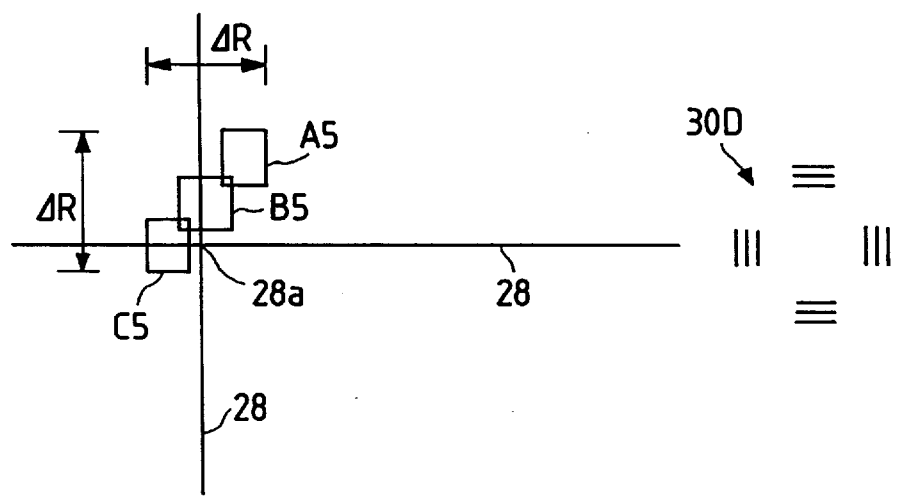
FIG. 5B is a view showing a reduced version of FIG. 5A.

FIG. 5A is an enlarged view of one cross pattern and its periphery of the rough searching alignment mark 28. FIG. 5B is a reduced version of FIG. 5A. In FIGS. 5A and 5B, W represents a width of a square effective field of view $20_{Ref}$ of the RA microscope 20 and ΔR represents a designed value of a sum of a writing error and a mounting error of the patterns relative to the outer configuration of the reticle 12.

Accordingly, as shown in FIG. 5B, one cross pattern 28a of the rough searching alignment mark 28 is always contained within a square area having the width of ΔR. What are to be detected are x and y coordinates of the cross pattern 28a. In this embodiment, the effective field of view $20_{Ref}$ having the width of W is scanned diagonally to the x and y axes in a direction passing at 45° to two axes of the alignment mark 28. The x and y coordinates of the cross pattern 28a are obtained as the x and y coordinates at that time when the alignment mark 28 is diagonally scanned.

For this purpose, an integer portion of a positive real number is represented by INTA. The number of search fields or the least number of scanning of the square area having the width ΔR with the effective field of view $20_{Ref}$ having the width W can be given by {INTA(ΔR/W)+1}. This number of search fields is previously obtained. The {INTA(AR/W)+1} effective fields of view A5, B5, C5, . . . , each having the width W are set diagonally to the square area having the width ΔR around the first effective field of view B5. The reticle fine driving stage 11 shown in FIG. 1 is driven to step the effective fields of view, thereby sampling images within each effective field of view while setting them successively within the effective field of view $20_{Ref}$ in FIG. 5A.

As shown in FIG. 5B, the cross pattern 28a of the alignment mark 28 to be searched is present within a search boundary having the width and length of at least ΔR×ΔR. The alignment mark 28 is large enough to the search boundary. Accordingly, to step the effective fields of view in a diagonal direction to the alignment mark 28 makes it possible to detect the coordinates of the cross pattern 28a of the alignment mark 28 with a least number of fields. The image processing at that time may be a one-dimensional image processing on image signals obtained by means of adding the scanning lines of all lines within the picked-up image.

FIGS. 6A to 6F show image signals obtained by means of so adding the scanning lines of all lines. FIGS. 6A and 6D represent image signals obtained along the x and y directions, respectively, within the effective field of view A5 in FIG. 5B. FIGS. 6B and 6E represent image signals obtained along the x and y directions, respectively, within the effective field of view B5 in FIG. 5B. FIGS. 6C and 6F represent image signals obtained along the x and y directions, respectively, within the effective field of view C5 in FIG. 5B. The x coordinate of the cross pattern 28a is obtained from the image signal shown in FIG. 6B while the y coordinate thereof is obtained from the image signal shown in FIG. 6F.

After detecting the searching reticle mark 28 in this manner, the rough searching alignment mark 27 is moved to the observation area of the RA microscope 19 at step 104 in FIG. 2A. The position of the alignment mark 27 is detected in the same manner as described above. In this event, the portion of the reference mark plate 6 where no pattern is included is moved within the exposing field of the projection optical system 8 to illuminate the portion from the bottom. The illumination light emitted from the reference mark plate 6 allows illumination of the rough searching alignment marks 27 and 28 from the backside (Zθ-axis driving stage side).

The above mentioned sequence roughly aligns the position of the rough searching alignment marks 27 and 28 and the reticle coordinate system relative to the observation areas 19R and 20R of the RA microscopes 19 and 20 in FIG. 4B. In addition, rough alignment of the observation areas 19R and 20R of the RA microscopes with the wafer coordinate system can be made by means of measuring the reference marks on the reference mark plate 6 in FIG. 1 through the RA microscopes 19 and 20. As a result, rough alignment is completed such that the fine alignment marks 29A, 29B, 29C, 29D, 30A, 30B, 30C and 30D are not overlapped with the reference marks (described below) of the reference mark plate 6.

In this embodiment, the alignment marks on the reticle 12 are formed of the rough searching alignment marks and the fine alignment marks for the purpose of reducing the diameter of the lens of the projection optical system 8. However, the rough searching alignment marks may be used as the fine alignment marks when a lens of the larger diameter can be available. In such a case, searching can be made in the same manner on the alignment marks by means of stepping in a diagonal direction as shown in FIGS. 5A and 5B. The searching of the alignment marks can be made simultaneously through the RA microscopes 19 and 20.

Next, a sequence for fine alignment is described. Detailed structure of the wafer stage and the reticle stage is described first.

Figure 7A:
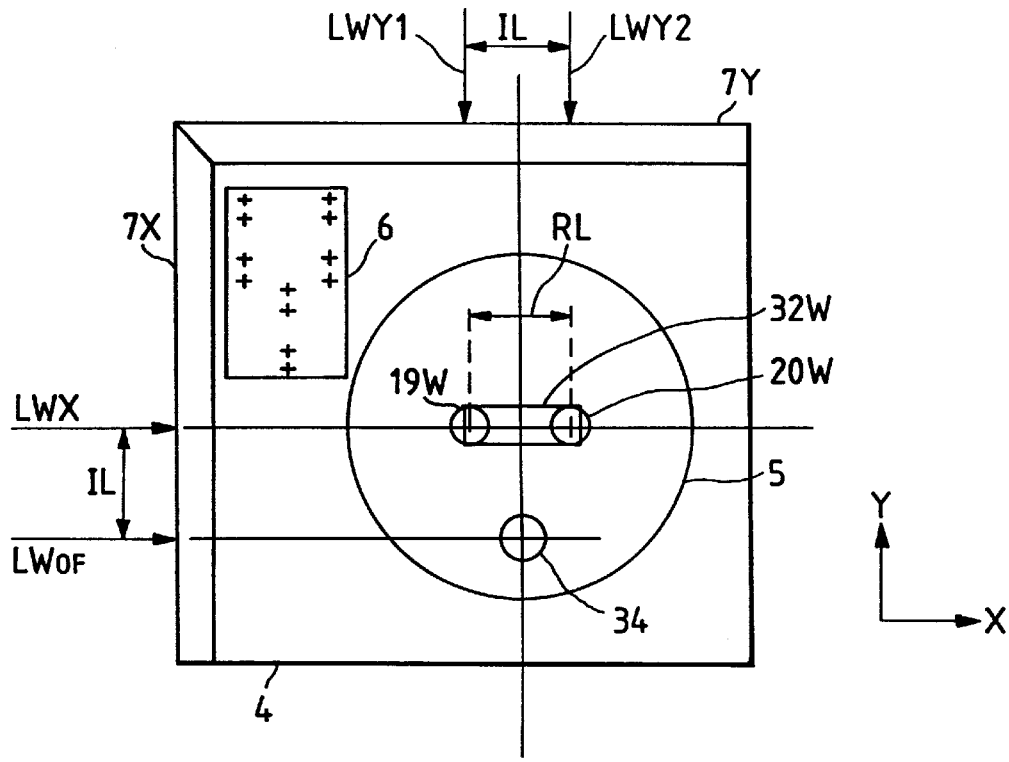
FIG. 7A is a plan view of a stage at a wafer side.

FIG. 7A is a plan view of the wafer stage. In FIG. 7A, the wafer 5 and the reference mark plate 6 are disposed on the Zθ-axis driving stage 4. Movable mirrors 7X and 7Y for the X and Y axes, respectively, are secured to the Zθ-axis driving stage 4. A slit-shaped illumination area 32W, corresponding to the slit-shaped illumination area 32 in FIG. 4B, is illuminated by an exposing light on the wafer 5. Observation areas 19W and 20W are conjugated with the observation area 19R and 20R, respectively, in FIG. 4B.

Laser beams LWX and $LW_{of}$ are directed to the movable mirror 7X at a distance IL in the direction parallel to the X axis along optical paths passing the optical axis of the projection optical system and a reference point of the alignment device 34, respectively. Laser beams LWY1 and LWY2 are directed to the movable mirror 7Y along optical paths parallel to the Y axis. During alignment and exposure, a coordinate value measured by an interferometer using the laser beam LWX is used as the X coordinate of the Zθ-axis driving stage 4. Used as the Y coordinate is an average $(Y_1+Y_2)/2$ of coordinate values $Y_1$ and $Y_2$ measured by interferometers using the laser beams LWY1 and LWY2, respectively. For example, the rotation amount in the rotation direction (θ direction) of the Zθ-axis driving stage 4 can be measured according to the difference between the coordinate values $Y_1$ and $Y_2$. The position and a rotation amount within an XY plane of the Zθ-axis driving stage 4 is controlled according to these coordinates.

In particular, for the Y direction or the scanning direction, an error due to air fluctuation or the like during scanning is relieved using an averaging effect by means of applying the average value of the measured results obtained by two interferometers. When the alignment device 34 of the off-axis type is used, the position in the X-axis direction is so controlled as not to cause a so-called Abbe's error according to measured values of an exclusive interferometer using the laser beam $LW_{of}$.

Figure 7B:
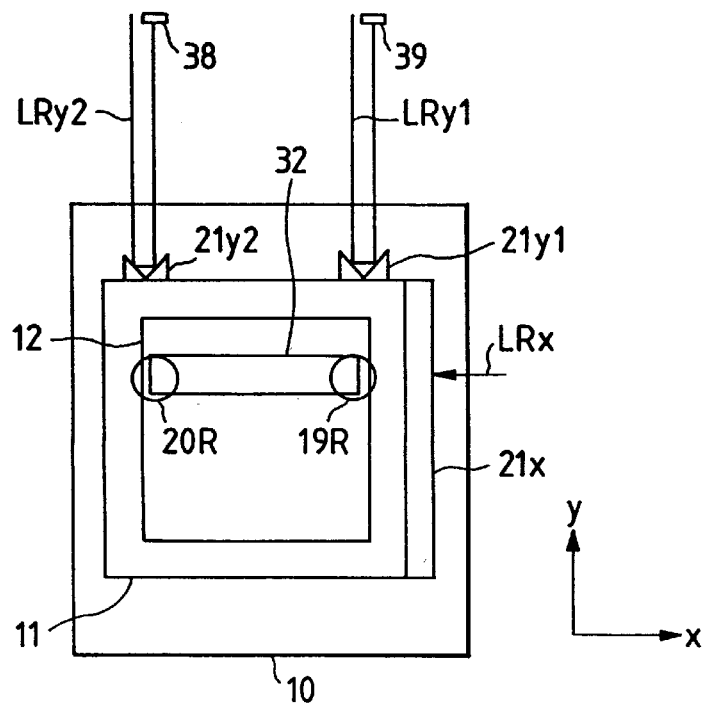
FIG. 7B is a plan view of a stage at a reticle side.

FIG. 7B is a plan view of the reticle stage. In FIG. 7B, the reticle fine driving stage 11 is mounted on the reticle Y-axis driving stage 10, on which the reticle 12 is held. A movable mirror 21x for the x axis and two movable mirrors 21y1 and 21y2 for the y axis are secured to the reticle fine driving stage 11. A laser beam LRx is directed to the movable mirror 21x in parallel with the x axis. Laser beams LRy1 and LRy2 are directed to the movable mirrors 21y1 and 21y2, respectively, in parallel with the y axis.

As in the case of the wafer stage, a coordinate in the y direction of the reticle fine driving stage 11 is an average value of $(y_1+y_2)/2$ of coordinates $y_1$ and $y_2$ measured by two interferometers using the laser beams LRy1 and LRy2, respectively. A coordinate in the x direction is a coordinate value measured by an interferometer using the laser beam LRx. The rotation amount in a direction (θ direction) of the reticle fine driving stage 11 is measured according to the difference between, for example, the coordinate values $y_1$ and $y_2$.

In this event, corner-cube reflector elements are used as the movable mirrors 21y1 and 21y2 in the y direction or the scanning direction. The laser beams LRy1 and LRy2 reflected from the movable mirrors 21y1 and 21y2 are in turn reflected back from reflection mirrors 39 and 38, respectively. More specifically, the interferometer for the reticle is a double-path interferometer. Accordingly, rotation of the reticle fine driving stage 11 does not shift or displace the position of the laser beams. As in the case of the wafer stage, the reticle 12 is provided with the slit-shaped illumination area 32 and the observation areas 19R and 20R of the RA microscopes 19 and 20, respectively. The Zθ-axis driving stage 4 in FIG. 7A and the reticle 12 can be observed only through the observation areas 19R and 20R. A relation between the reticle 12 and the Zθ-axis driving stage 4 is so measured as to improve the rotation accuracy of the reticle 12 and the wafer 5 as well as the alignment accuracy on exposing. A method thereof is described in conjunction with FIGS. 8A, 8B, 8C, 8D, 8E and 9.

Figure 8A:
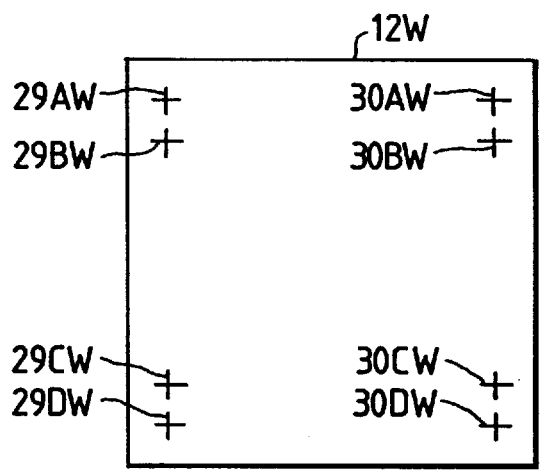
FIG. 8A is a projection view showing arrangement of marks on the reticle.
Figure 8B:
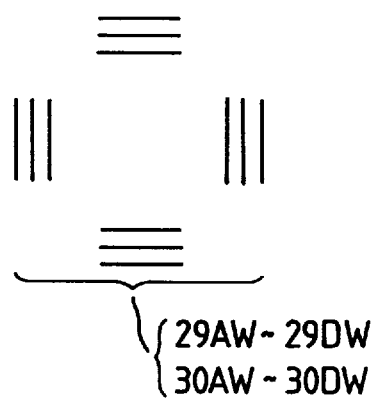
FIG. 8B is an enlarged projection view showing an example of marks on the reticle.

FIG. 8A shows an reticle image 12W obtained by means of projecting the reticle 12 to the reference mark plate 6 in FIG. 7A. In FIG. 8A, shown are mark images 29AW, 29BW, 29CW and 29DW conjugated with the fine alignment marks 29A, 29B, 29C and 29D, respectively, in FIG. 4A and mark images 30AW, 30BW, 30CW and 30DW conjugated with the fine alignment marks 30A, 30B, 30C and 30D, respectively. Each of the mark images 29AW, 29BW, 29CW, 29DW, 30AW, 30BW, 30CW and 30DW is formed of four sides each comprising three linear patterns as shown in FIG. 8B.

Figure 8C:
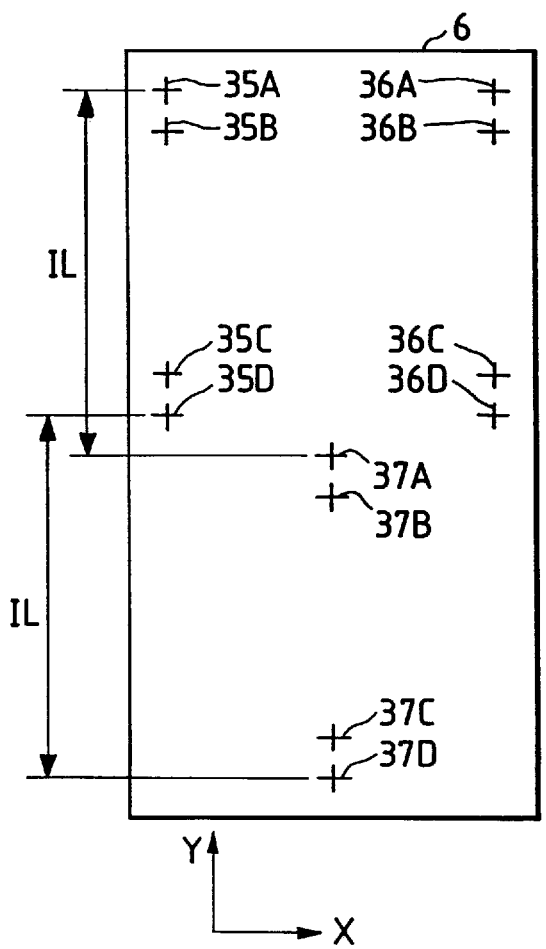
FIG. 8C is a plan view showing arrangement of the reference marks on a reference mark plate 6.

FIG. 8C shows arrangement of reference marks on the reference mark plate 6. Formed on the reference mark plate 6 in FIG. 8C are reference marks 35A, 35B, 35C, 35D, 36A, 36B, 36C and 36D arranged in a manner similar to the mark images 29AW, 29BW, 29CW, 29DW, 30AW, 30BW, 30CW and 30DW in FIG. 8A. These reference marks are illuminated by an illumination light that is equal in wavelength to the exposing light. A reference mark 37A is also provided on the reference mark plate 6 at a position away from a center between the reference marks 35A and 36A at a distance IL in the Y direction or the scanning direction. The distance IL corresponds to the base line amount, the distance between the reference point of the projection optical system 8 in FIG. 1 and the reference point of the alignment device 34 of the off-axis type. Likewise, reference marks 37B, 37C and 37D are formed as positions away from centers between the reference marks 35B and 36B, between the reference marks 35C and 36C, and between the reference marks 35D and 36D, respectively, at a distance IL in the Y direction.

Figure 8D:
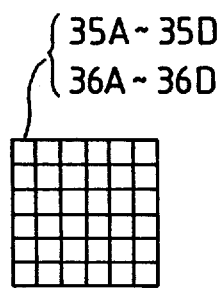
Figure 8E:
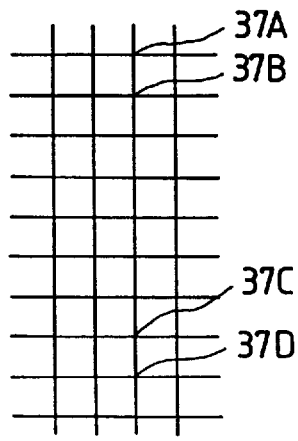

Each of the reference marks 35A, 35B, 35C, 35D, 36A, 36B, 36C and 36D is formed of linear patterns of 7-row by 7-column as shown in FIG. 8D. The reference marks 35A, 35B, 35C, 35D, 36A, 36B, 36C, and 36D have sizes smaller than the mark images 29AW, 29BW, 29CW, 29DW, 30AW, 30BW, 30CW and 30DW in FIG. 8B. The reference marks 37A, 37B, 37C and 37D are, as shown in FIG. 8E, associated lattice points of a grid pattern formed at a predetermined pitch in the X and Y directions.

In such a case, at step 105 in FIG. 2A, a relative position relation and a relative rotation angle of the reticle 12 and the RA microscopes 19 and 20 are calculated on the basis of the results obtained at the steps 103 and 104 to move the fine alignment marks 29A and 30A in FIG. 4A into the observation area 19R and 20R of the RA microscopes 19 and 20, respectively. Subsequently, at step 106, the reference marks 35A and 36A on the reference mark plate 6 in FIG. 8C are moved into the observation areas 19W and 20W (see FIG. 9) conjugated with the observation areas 19R and 20R, respectively. As a result, the mark image 29AW and the reference mark 35A are observed simultaneously within the observation area 19W and the mark image 30AW and the reference mark 36A are observed simultaneously within the observation area 20W as shown in a portion depicted by 220 in FIG. 9. Subsequently, at step 107 in FIG. 2A, the images observed through the RA microscopes 19 and 20 are converted into image pick-up signals and sampled. At the same time, the detection signals of the associated reference mark images are also sampled in the alignment device 34 of the off-axis type.

At the portion 220 in FIG. 9, the reticle image 12W or the projection image of the reticle is projected to the reference mark plate 6. As shown in a portion 222 in FIG. 9, the observation areas 19W and 20W are located at positions passing the optical axis within the exposing field of the projection optical system 8. The reference mark 37A is within the observation area of the alignment device 34 of the off-axis type. As in the case of the slit scanning exposure, the reticle fine driving stage 11 in FIG. 7B is moved downward (to a −y direction) in synchronism with movement of the Zθ-axis driving stage 4 in FIG. 7A upward (to the Y direction). As a result, the reference mark plate 6 and the reticle image 12W are moved together to the Y direction as shown in 220 and 221 in FIG. 9. In this event, the observation areas 19W and 20W of the RA microscopes 19 and 20 and the alignment device 34 of the off-axis type are all fixed, so that from a set of marks with a symbol A (the mark images 29AW, 30AW, the reference marks 35A, 36A and 37A) to a set of marks with a symbol D (the mark images 29DW, 30DW, the reference marks 35D, 36D and 37D) are moved under the observation areas 19W and 20W and the alignment device 34.

At a first stop position after initiation of alignment shown in the portion 220 in FIG. 9, the mark image 29AW and the reference mark 35A are located under the observation area 19W. The mark image 30A and the reference mark 36A are located under the observation area 20W. The reference mark 37A is located under the alignment device 34 of the off-axis type. These marks with the symbol A are all observed at the same time. After completion of measurement at 10 the first stop position, the reticle image 12W and the reference mark plate 6 are moved synchronously to a second stop position by the stepping operation. The set of marks observed at the first stop position under the observation areas 19W and 20W and the alignment device 34 is a set of marks with the symbol A while the set of marks present at this second stop position under the observation areas 19W and 20W and the alignment device 34 is a set of marks with a symbol B (the mark image 29BW in FIG. 8A, the reference marks 35B, 37B in FIG. 8C or the like).

By means of repeating the above mentioned sequence for third and fourth stop positions (as shown in 221 in FIG. 9), the mark image of the reticle image 12W and the reference marks on the reference mark plate 6 are measured through the RA microscopes 19 and 20 and the alignment device 34 of the off-axis type in the order of the set of marks with the symbol A, the set of marks with the symbol B, the set of marks with the symbol C and the set of marks with the symbol D. This corresponds to the operation illustrated in the steps 105 through 110 in FIGS. 2A and 2B. The so obtained measured result is clearly shown in FIG. 10.

Figure 10:
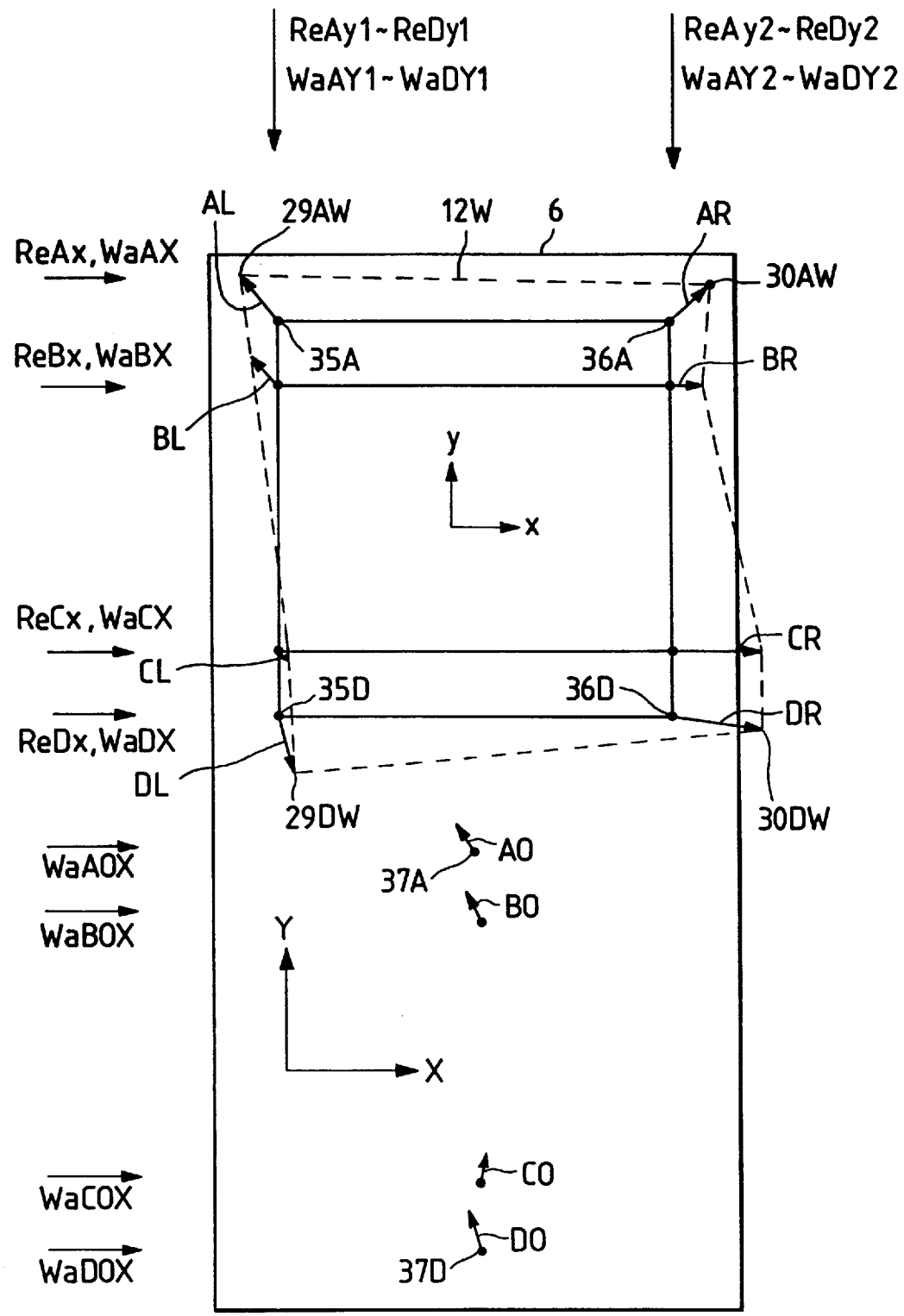
FIG. 10 is obtained by means of vectors obtained by means of measuring the reticle alignment and the base line amount.

In FIG. 10, a vector of the alignment error of the reference mark 35A through the mark image 29AW is referred to as AL that is obtained by means of correcting the measured result obtained through the RA microscope 19 in the following manner. Likewise, vectors of the alignment errors of the reference marks 35B, 35C and 35D through the mark image 29BW, 29CW and 29DW are referred to as BL, CL and DL, respectively. Likewise, AR represents a vector of the alignment error of the reference mark 36A through the mark image 30AW. BR, CR and DR represent vectors of the alignment errors of the reference marks 36B, 36C and 36D through the mark image 30BW, 30CW and 30DW, respectively. In addition, an error vector from the reference marks 37A, 37B, 37C and 37D to the reference point of the alignment device 34 are referred to as AO, BO, CO and DO, respectively, that are obtained by means of correcting the measured result obtained through the alignment device 34 of the off-axis type in a manner described below.

ReAx, ReBx, ReCx and ReDx represent the coordinate values in the x direction measured by the interferometer 14 at the reticle side in FIG. 1, i.e., the coordinate values obtained by using the laser beam LRx in FIG. 7B when the error vectors AL, AR, BL, BR, CL, CR, DL and DR are obtained. ReAy1, ReBy1, ReCy1, ReDy1, ReAy2, ReBy2, ReCy2 and ReDy2 represent the coordinate values in the y direction measured by the interferometer 14 at the reticle side in FIG. 1, i.e., the coordinate values obtained by using the laser beams LRy1 and LRy2 in FIG. 7B when the error vectors AL, AR, BL, BR, CL, CR, DL and DR are obtained. WaAx, WaBx, WaCx and WaDx represent the coordinate values in the X direction measured by the interferometer 13 at the wafer side in FIG. 1, i.e., the coordinate values obtained by using the laser beam LWX in FIG. 7A when the error vectors AL, AR, BL, BR, CL, CR, DL and DR are obtained. WaAY1, WaBY1, WaCY1, WaDY1, WaAY2, WaBY2, WaCY2 and WaDY2 represent the coordinate values in the Y direction measured by the interferometer 13 at the reticle side in FIG. 1, i.e., the coordinate values obtained by using the laser beams LWY1 and LWY2 in FIG. 7A when the error vectors AL, AR, BL, BR, CL, CR, DL and DR are obtained.

WaAOX, WaBOX, WaCOX and WaDOX represent the coordinate values in the X direction measured by the interferometer exclusive for the alignment device of the off-axis type at the wafer side in FIG. 1, i.e., the coordinate values obtained by using the laser beam $LW_{OF}$ in FIG. 7A when the error vectors AO, BO, CO and DO. In this event, as shown in FIG. 7A, the distance between the laser beams LWY1 and LWY2 at the wafer side in the X direction is IL and the distance at the wafer side between the laser beams LRy1 and LRy2 at the reticle side is RL.

Next, structure of the RA microscope 19 in FIG. 1 is described in detail for use in describing how to obtain the error vector AL or the like.

Figure 11:
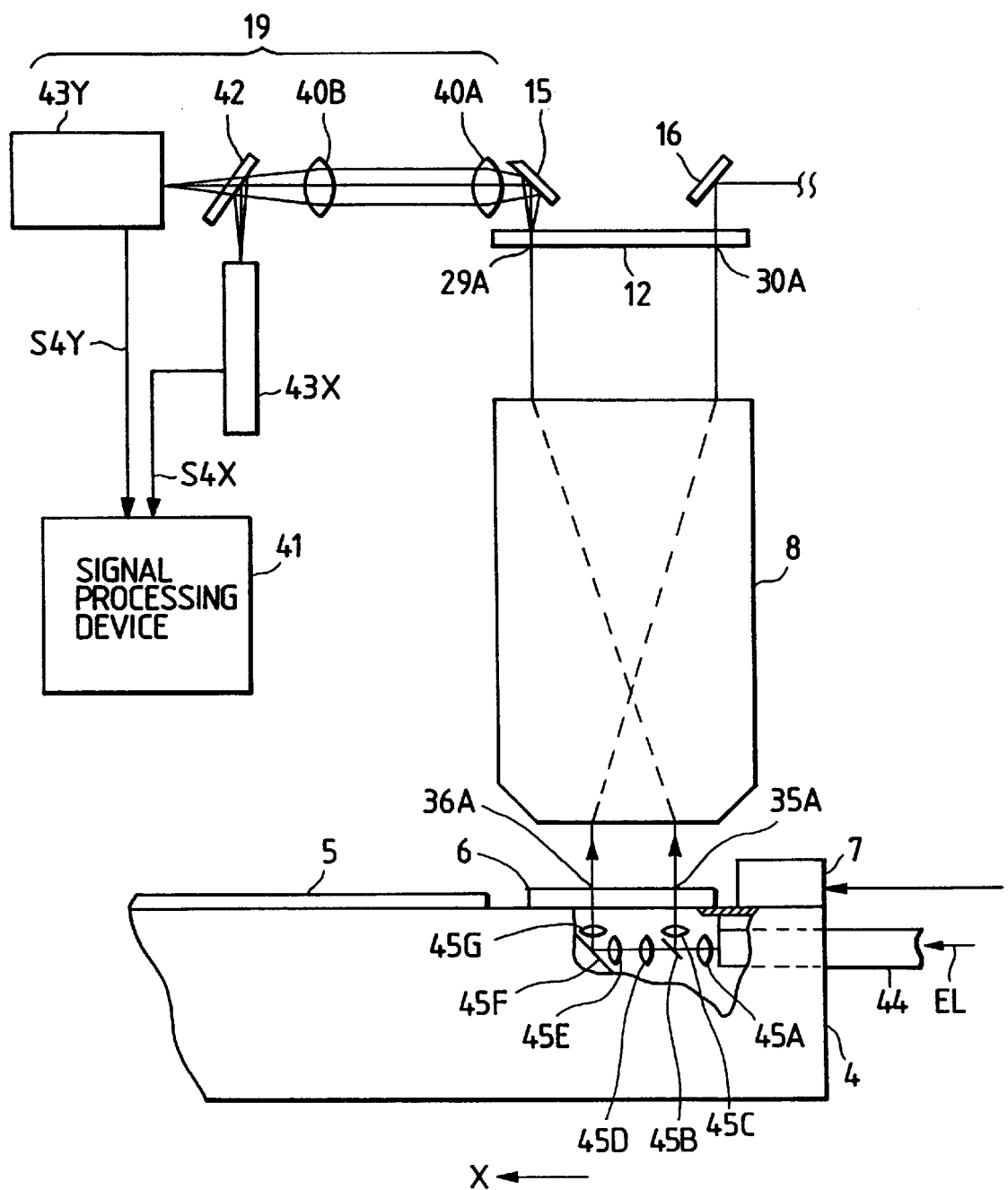
FIG. 11 is a partially cutaway structural diagram showing structure of a reticle alignment microscope 19 and an illumination system.

FIG. 11 shows the RA microscope 19 and its illumination system. In FIG. 11, an illumination light EL having the same wavelength as the exposing light is introduced into the Zθ-axis driving stage 4 from the outside of the Zθ-axis driving stage 4 through an optical fiber 44. An exposing light may be relayed through lens systems rather than using the optical fiber 44. The so introduced illumination light illuminates the reference marks 35A, 35B, 35C and 35D on the reference mark plate 6 through a lens 45A, a beam splitter 45B and a lens 45C. The illumination light transmitted through the beam splitter 45B illuminates the reference marks 36A, 36B, 36C and 36D on the reference mark plate 6 through a lens 45D, a lens 45E, a mirror 45F and a lens 45G.

Figure 12A:
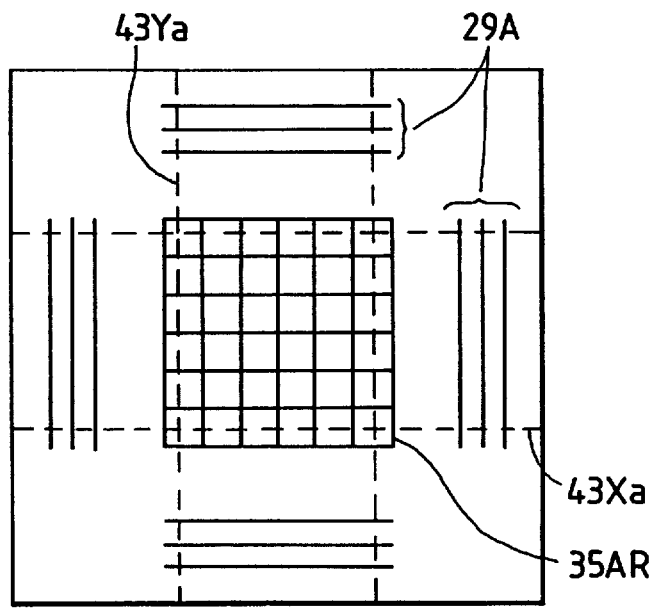
FIG. 12A is a view showing an image observed through the image pick-up device in FIG. 11.

For example, the light transmitted through the reference mark 35A focuses an image of the reference mark 35A on the file alignment mark 29A on the reticle 12. The light from the image of the reference mark 35A and the alignment mark 29A is reached to a half mirror 42 through a deflection mirror 15, a lens 40A and a lens 40B. The light divided into two portions through the half mirror 42 are directed to image pick-up surfaces of image pick-up devices 43X and 43Y, respectively, for the X and Y axes, each of which being formed of two dimensional charged-coupled-device (CCD). The image 35AR of the reference mark 35A and the fine alignment mark 29A as shown in FIG. 12A are projected on the image pick-up devices 43Y and 43X, respectively. In this event, an image pick-up field 43Xa of the image pick-up device 43 for the X axis is an area parallel to the X direction of the wafer stage and the direction of the horizontal scanning lines also corresponds to the X direction. An image pick-up field 43Ya of the image pick-up device 43Y for the Y axis is an area parallel to the Y direction of the wafer stage and the direction of the horizontal scanning line corresponds to the Y direction.

Accordingly, a displacement amount in the X direction between the reference mark 35A and the alignment mark 29A can be obtained according to an averaging of image pick-up signals S4X obtained by the image pick-up device 43X. A displacement amount in the Y direction between the reference mark 35A and the alignment mark 29A can be obtained according to an averaging of image pick-up signals S4Y obtained by the image pick-up device 43Y. These image pick-up signals S4X and S4Y are supplied to a signal processing device 41 (See FIG. 11).

Figure 12B:
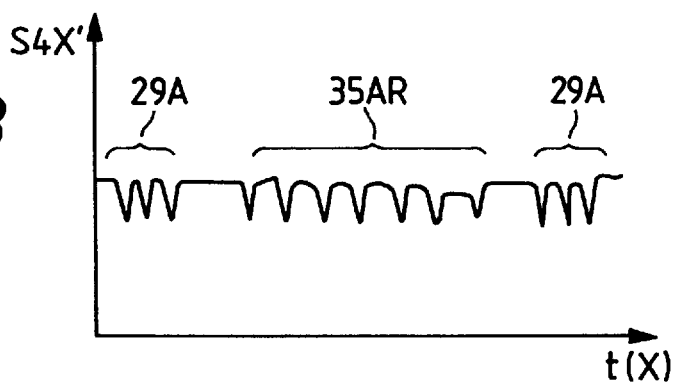
FIGS. 12B and 12C are views showing waveforms indicative of image signals in an X direction and a Y direction corresponding to the image shown in FIG. 12A.
Figure 12C:
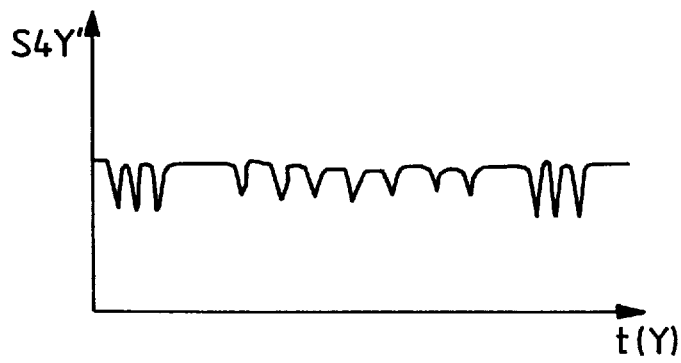

More specifically, description is made in conjunction with an exemplified case where the set of marks with the symbol A is subjected to alignment. For example, the alignment mark 29A and the reference mark 35AR shown in FIG. 12A are observed through the RA microscope 19 at the same time. In FIG. 12A, the image signals S4X and S4Y within the image pick-up fields 43Xa and 43Ya enclosed by broken lines are detected as digital signals by means of carrying out an analog-to-digital conversion in the signal processing device 41. The image data on the individual scanning lines are averaged independently for the X and Y axes in the signal processing device 41. The averaged image signals S4X' and S4Y' for the X and Y axes, respectively, are as shown in FIGS. 12B and 12C, respectively. These image data are processed as one-dimensional image processing signals.

Calculation and processing on the so obtained signals in the signal processing device 41 produces relative displacements $AL'_x$ and $AL'_y$ in the X and Y directions between the mark image 29AW of the reticle 12 and the reference mark 35A of the reference mark plate 6 in FIG. 10. Using the RA microscope 20 in FIG. 1, obtained are relative displacements $AR'_X$ and $AR'_Y$ in the X and Y directions between the mark image 30AW and the reference mark 36A. Likewise, obtained are relative displacements between the mark images 29BW, 29CW and 29DW and the reference marks 35B, 35C and 35D, respectively, in FIG. 10 and relative displacements between the mark images 30BW, 30CW and 30DW and the reference marks 36B, 36C and 36D, respectively.

However, the image signal corresponding to the alignment mark 29A and the image signal corresponding to the reference mark image 35AR in FIG. 12B are controlled in position by the interferometer at the reticle side and the interferometer at the wafer side, respectively. Accordingly, measurement errors (=measured value–set value), ΔReAx, ΔReAy1, ΔReAy2, ΔWaAX, ΔWAAY1, and ΔWaAY2 are caused due to following errors at the individual stages with respect to the measured coordinates ReAx, ReAy1 and ReAy2 obtained by the interferometer at the reticle side and the measured coordinates WaAX, WaAY1 and WaAY2 obtained by the interferometer at the wafer side during measurement of the set of marks with the symbol A (29AW, 35A, 30AW and 36A in FIG. 10). These measurement errors are contained in the relative displacements $AL'_X$ and $AL'_Y$ obtained through the calculation.

With this respect, the results obtained by means of subtracting the errors from the relative displacements obtained through measurement correspond to an X component $AL_X$ and a Y component $AL_Y$ of the vector of the alignment error in FIG. 10. In this event, (1/M) in a following equation represents a reduction magnification of the projection optical system 8, while IL and RL represent the distances described in conjunction with FIG. 7A.

$$AL_X = AL'_X - \Delta ReAx/M - \Delta WaAX \quad \text{(Equation 1)},$$

and $$AL_Y = AL'_Y - \Delta ReAy1/M - \{(\Delta WaAY1 + \Delta WaAY2)/2 - (\Delta WaAY2 - \Delta WaAY1) \cdot RL/IL\} \quad \text{(Equation 2)}.$$

Likewise, an X component $AR_X$ and a component $AR_Y$ of the vector AR of the alignment error in FIG. 10 can be given by following equations.

$$AR_X = AR'_X - \Delta ReAx/M - \Delta WaAX \quad \text{(Equation 3)},$$

and $$AR_Y = AR'_Y - \Delta ReAy2/M - \{(\Delta WaAY1 + \Delta WaAY2)/2 - (\Delta WaAY2 - \Delta WaAY1) \times RL/IL\} \quad \text{(Equation 4)}.$$

Figure 13:
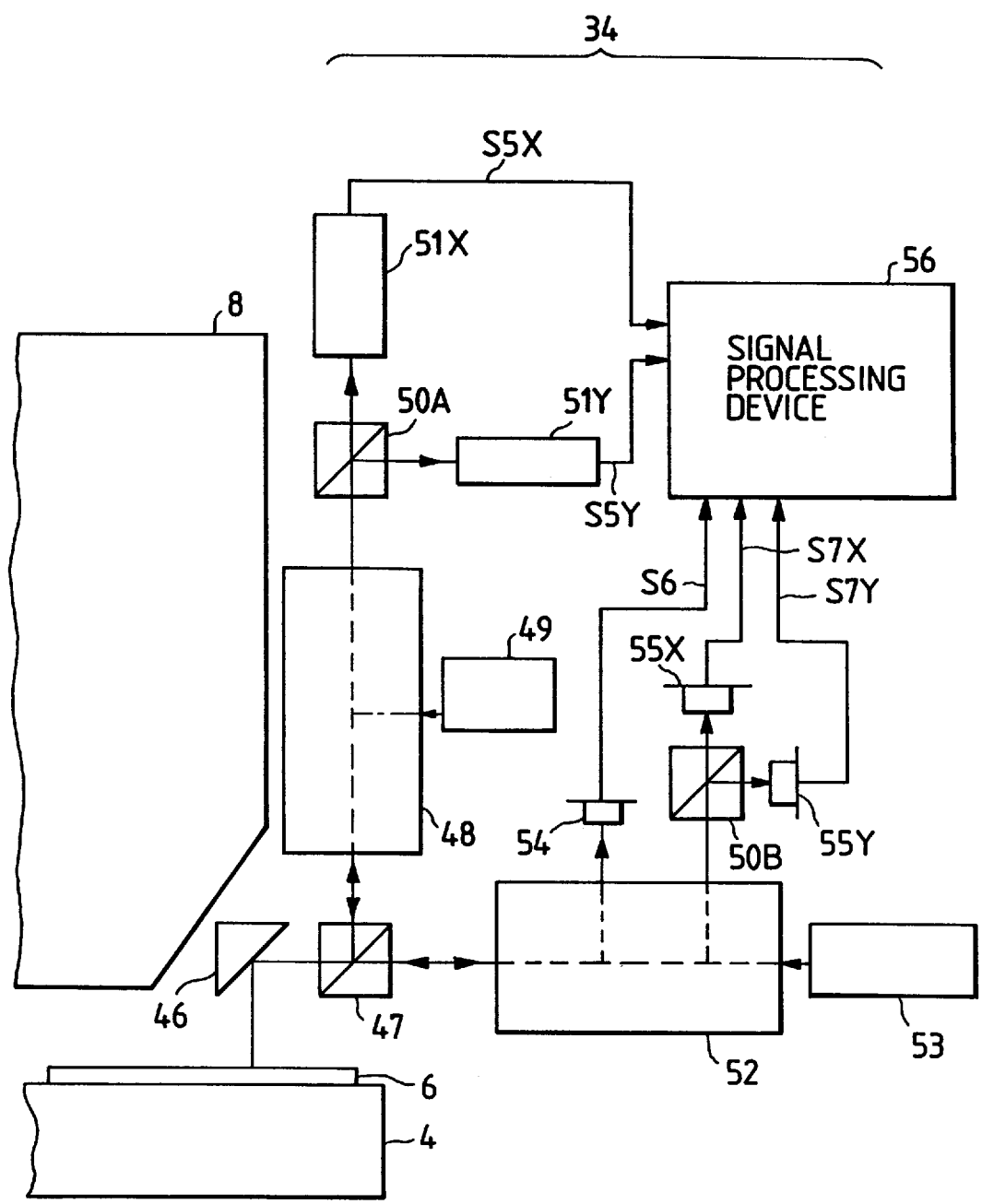
FIG. 13 is a structural diagram showing an alignment device 34 of an off-axis type.

Next, structure of the alignment device 34 is described in conjunction with FIG. 13 for use in describing the error vectors AO, BO, CO and DO in FIG. 10 obtained by means of correcting the results obtained by the alignment device 34 of the off-axis type.

FIG. 13 shows structure of the alignment device 34. In FIG. 13, the light from the reference mark on the reference mark plate 6 is deflected from a deflection mirror unit 46 and is directed to a half prism 47. The light reflected from the half prism 47 is directed to an alignment optical system 48 (hereinafter, referred to as "FIA optical system") of an image processing type using white light. The light transmitted through the half mirror is directed to an alignment optical system 52 (hereinafter, referred to as "LIA optical system") for use in detecting the diffraction light from lattice marks using a heterodyne beam.

Describing about the FIA optical system 48, the illumination light from an illumination light source 49 is passed through the FIA optical system 48 and is deflected through the half prism 47 and the deflection mirror 46 to illuminate the reference marks on the reference mark plate 6. The back light therefrom goes back to the FIA optical system through the same optical path. The light transmitted through the FIA optical system is directed to a half prism 50A. The light beam transmitted through the half prism 50A focuses an image of the reference mark of the reference mark plate 6 on the image pick-up surface of an image pick-up device 51X for the X axis formed of a two-dimensional CCD. The light beam reflected from the half prism 50A focuses an image of the reference mark of the reference mark plate 6 on the image pick-up surface of an image pick-up device 51Y for the Y axis formed of a two-dimensional CCD.

Figure 14A:
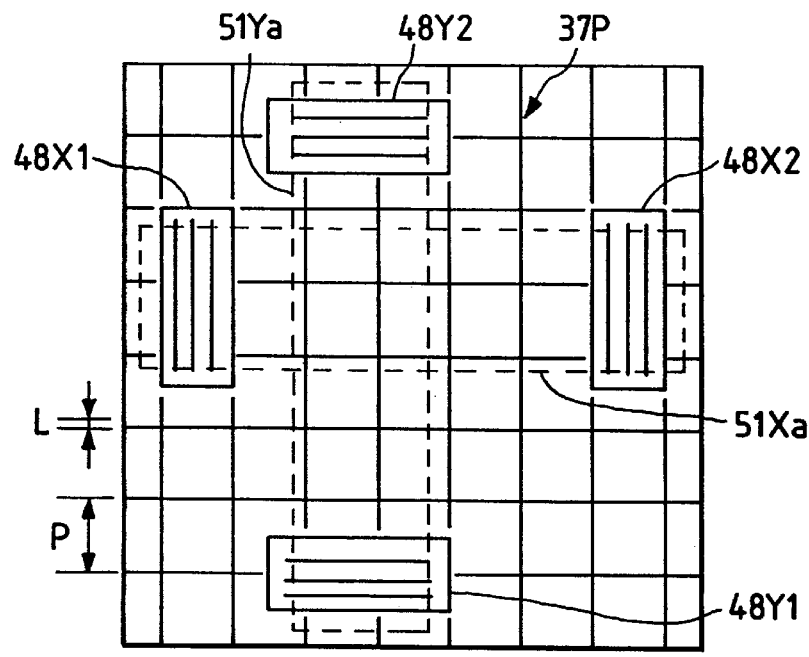
FIG. 14A is a view showing an image observed through the image pick-up device in FIG. 13.

On the image pick-up surfaces of the image pick-up devices 51X and 51Y, images shown in FIG. 14A are focused. The reference marks on the reference mark plate 6 are grating points of the grating pattern. FIG. 14A shows an image 37P of the grating pattern. It is assumed that P and L represent grating pitch on the reference mark plate 6 of the image 37P of the grating pattern and a width of a dark line, respectively, the width L is significantly smaller than the pitch P. Focused on the image pick-up surface are reference mark (index mark) images 48X1 and 48X2 in the X direction and index mark images 48Y1 and 48Y2 in the Y direction illuminated by another illumination light other than the illumination light for the reference mark plate 6. The position of the reference marks on the reference mark plate 6 can be detected with the position of the index marks as the reference.

Figure 14B:
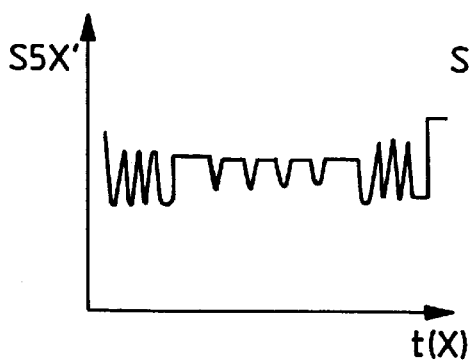
FIGS. 14B and 14C are views showing waveforms indicative of image signals in an X direction and a Y direction corresponding to the image shown in FIG. 14A.
Figure 14C:
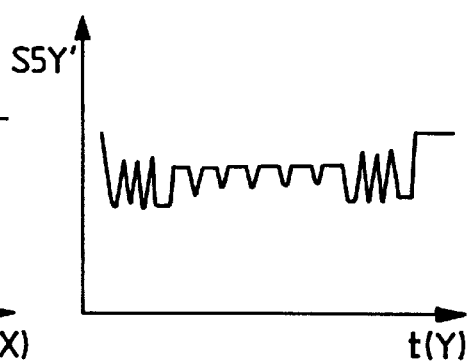

More specifically, image pick-up area 51Xa and 51Ya in the directions conjugated with the X and Y directions, respectively, in FIG. 14A are picked up through the image pick-up devices 51X and 51Y in FIG. 13. The directions of the horizontal scanning lines of the image pick-up devices 51X and 51Y are directions conjugated with the X and Y directions, respectively. Image pick-up signals S5X and S5Y obtained by the image pick-up devices 51X and 51Y, respectively, are supplied to a signal processing device 56 in FIG. 13. The signal processing device 56 averages the image pick-up signals S5X and S5Y to produce image signals S5X' and S5Y' shown in FIGS. 14B and 14C, respectively. A displacement of the directed reference mark on the reference mark plate 6 is obtained according to these image signals. More detailed structure is disclosed in Japanese Patent Application No. 4-16589.

It is assumed that relative displacements in the X and Y directions of the reference mark 37A relative to the reference mark obtained as a result of the image processing in FIG. 14A are represented by $AO'_{fX}$ and $AO'_{fY}$ when the reference mark to be detected is the reference mark 37A in FIG. 10. In this event, the position of the reference mark plate 6 is controlled on the wafer coordinate system, so that values obtained by subtracting the follow error and the rotation error of the Zθ-axis driving stage 4 in FIG. 7A from the measured result are an X component $AO_X$ and a Y component $AO_Y$ of the error vector AO in FIG. 10. The X component $AO_X$ and the Y component $AO_Y$ corresponding to the FIA optical system 48 in FIG. 13 are represented by $AO_{fX}$ and $AO_{fY}$. That is, following equations are given:

$$AO_{fX} = AO'_{fX} - (WaAOX - WaAX) \quad \text{(Equation 5)},$$

and $$AO_{fY} = AO'_{fY} - (WaAY1 + WaAY2)/2 \quad \text{(Equation 6)}.$$

On the other hand, in the alignment system containing the LIA optical system 52 in FIG. 13, a laser beam emitted from a laser beam source 53 is transmitted through the LIA optical system 52 and the half prism 47, which is then deflected from the deflection mirror 46 and directed to the reference mark of a diffraction grating shape on the reference mark plate 6. The diffracted light from the reference mark goes back to the LIA optical system 52 through the same optical path. The diffracted light transmitted through the LIA optical system 52 is divided into two portions through a half prism 50B and directed to photosensitive elements 55X and 55Y for the X and Y directions, respectively.

In this event, the laser beam emitted from the laser beam source 53 in the LIA optical system 52 is divided into two portions. A frequency difference of Δf is caused between frequencies of these two laser beams by an internal frequency shifter. Interference light of these two laser beams is received by a photosensitive element 54. The photosensitive element 54 produces a reference signal S6 having a frequency of Δf. Two laser beams having different frequencies (heterodyne beams) are directed to the reference mark of the diffraction grating shape on the reference mark plate 6 at an adequate incident angle. A ±1 order diffracted light of these two laser beams from the reference mark returns in parallel in an orthogonal manner relative to the reference mark plate 6. An interference light of the ±1 order light has an intensity varied at the frequency Δf and a phase thereof varies depending on the X and Y coordinates of the reference mark. The photosensitive element 55X produces a beat signal S7X having the frequency Δf and a phase varied depending on the X coordinate of the reference mark. The photosensitive element 55Y produces a beat signal S7Y having the frequency Δf and a phase varied depending on the Y coordinate of the reference mark. The reference signal S6 and the beat signals S7X and S7Y are supplied to the signal processing device 56.

Figure 14D:
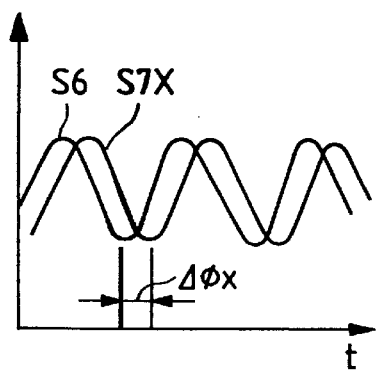
FIGS. 14D and 14E are views showing detection signals obtained through an LIA optical system shown in FIG. 13.
Figure 14E:
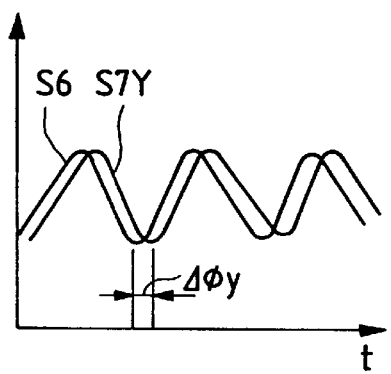

The signal processing device 56 in FIG. 13 calculates a displacement $AO'_{LX}$ in the X direction of the reference mark 37A according to a phase difference $\Delta\phi x$ between the reference signal S6 and the beat signal S7X as shown in FIG. 14D and calculates a displacement $AO'_{LX}$ in the Y direction of the reference mark 37A according to a phase difference $\Delta\phi_Y$ between the reference signal S6 and the beat signal S7X as shown in FIG. 14E when the reference mark to be detected is the reference mark 37A in FIG. 10. When the following error and the rotation error of the Zθ-axis driving stage 4 in FIG. 7A are subtracted from the above calculation result, the X component $AO_X$ and Y component $AO_Y$ of the error vector in FIG. 10 can be obtained. Let the X and Y components $AO_X$ and $AO_Y$ of the LIA optical system 52 in FIG. 13 be $AO_{LX}$ and $AO_{LY}$, respectively. That is, the following equation can be given:

$$AO_{LX} = AO'_{LX} - (WaAOX - WaAX) \quad \text{(Equation 7)}$$

and $$AO_{LY} = AO'_{LY} - (WaAY1 + WaAY2)/2 \quad \text{(Equation 8)}.$$

In the above mentioned manner, eight data $AL_X$, $AL_Y$, $AR_X$, $AR_Y$, $AO_{fX}$, $AO_{fY}$, $AO_{LX}$ and $AO_{LY}$ are measured by means of performing alignment at the positions of the mark group with the symbol A in FIG. 10. Measurement on the mark groups with the symbols A through D in such a sequence produces thirty-two (=8×4) data. Of these thirty-two data, the data obtained through the RA microscopes 19 and 20 are stored as measured data $D_{xn}$, $D_{yn}$ while the data obtained through the alignment device 34 of the off-axis type is stored as measured data $A_{xn}$, $A_{yn}$. Subsequently, the operation proceeds step 111 in FIG. 2B. At the step 111 in FIG. 2B, it is assumed that coordinates in the x and y directions are $F_{xn}$ and $F_{yn}$ on a coordinate system where the reticle coordinate system and the wafer coordinate system are adapted to convert with only the linear error with respect to the measured data $D_{xn}$, $D_{yn}$ corresponding to the RA microscopes 19 and 20. The following relation holds:

$$\begin{bmatrix} Fxn \\ Fyn \end{bmatrix} = \begin{bmatrix} Rx & -Rx \cdot (\omega + \theta) \\ Ry \cdot \theta & Ry \end{bmatrix} \begin{bmatrix} Dxn \\ Dyn \end{bmatrix} + \begin{bmatrix} Ox \\ Oy \end{bmatrix}. \quad \text{(Equation 9)}$$

In addition, let nonlinear errors in the x and y directions be $\epsilon_{xn}$ and $\epsilon_{yn}$, respectively, then the following equation can be given:

$$\begin{bmatrix} \epsilon xn \\ \epsilon yn \end{bmatrix} = \begin{bmatrix} Fxn \\ Fyn \end{bmatrix} - \begin{bmatrix} Dxn \\ Dyn \end{bmatrix} = \quad \text{(Equation 10)}$$

$$\begin{bmatrix} 1 - Rx & -Rx \cdot (\omega + \theta) \\ Ry \cdot \theta & 1 - Ry \end{bmatrix} \begin{bmatrix} Dxn \\ Dyn \end{bmatrix} + \begin{bmatrix} Ox \\ Oy \end{bmatrix}.$$

Six parameters in Equation 9, Rx, Ry, θ, ω, Ox and Oy, are calculated by using the least square approximation to minimize the nonlinear error ($\epsilon_{xn}$, $\epsilon_{yn}$). In this event, the scaling parameter Rx in the x direction indicates a magnification error in the x direction between the reticle 12 and the reference mark plate 6. The scaling parameter Ry indicates a scaling error in the scanning direction (y direction) between the reticle coordinate system and the wafer coordinate system. The angle parameter θ represents the rotation error between the reticle 12 and the reference mark plate 6. The angle parameter ω represents the parallelism in the scanning direction of the reticle coordinate system and the wafer coordinate system. The offset parameters Ox and Oy represent offset values in the x and y directions, respectively.

Next, at steps 112 and 113 in FIG. 2B, the base line amount is obtained. Let averages of the data $A_{xn}$ and $A_{yn}$ measured through the alignment device 34 of the off-axis type be <Ax> and <Ay>, respectively, then the offset during measurement of the base line amount becomes (<Ax>−Ox, <Ay>−Oy). Accordingly, control should be switched during alignment from the interferometer using the laser beam LWX in FIG. 7A (hereinafter, also refereed to as "exposing interferometer LWX") to the interferometer using the laser beam $LW_{OF}$ (hereinafter, also referred to as "off-axis exclusive interferometer $LW_{OF}$"). When the FIA optical system 48 in FIG. 13 is used, averages of the measured data $A_{xn}$ and $A_{yn}$ are represented by <Afx> and <Afy>, respectively. Then, the offset of the offset (<Afx>−Ox, <Afy>−Oy) is taken into consideration in the measured values of the interferometer corresponding to the laser beams LWY1, LWY2 and $LW_{OF}$ to perform the alignment. On the other hand, when the LIA optical system 52 in FIG. 13 is used, averages of the measured data Axn and Ayn are represented by <ALx> and <ALy>, respectively. Then, the offset (<ALx>−Ox, <ALy>−Oy) is taken into consideration in the measured values of the interferometer.

According to the above, the base line amount obtained corresponds to what the base line amount (distance IL) is corrected with the offset of (<Afx>−Ox, <Afy>−Oy) or the offset of (<ALx>−Ox, <ALy>−Oy).

The above mentioned correction technique means that the reference coordinate system of the stage coordinate system is set according to the reference marks on the reference mark plate 6. In such a case, in other words, an axis passing the reference marks 37A, 37B, 37C and 37D on the reference mark plate 6 serves as a reference axis, and obtained is a read value (yawing value) of the off-axis exclusive interferometer $LW_{OF}$ on this reference axis with the read value of the exposing interferometer LWX of zero on this reference axis. During exposure, by using, as "values of the interferometers for delivery", the read value of the exposing interferometer LWX and the result of yawing value correction made on the read value (yawing value) of the off-axis exclusive interferometer LW$_{OF}$, the positioning of the wafer 5 is performed according to these values for the delivery.

On the other hand, in FIG. 7A for example, an alternative method may be used where the movable mirror 7X for the X axis is used as the reference axis of the stage coordinate system. In such a case, in a condition shown in FIG. 7A, the read values of the exposing interferometer LWX and the off-axis exclusive interferometer LW$_{OF}$ are reset simultaneously (to zero), the measured values are used for the subsequent exposure without using the interferometer values for delivery. On the other hand, during alignment, obtained is an inclined angle $\theta_{XF}$ of the reference axis passing the reference marks 37A, 37B, 37C and 37D on the reference mark plate 6 relative to the movable mirror 7X. Then, such a value is used that is obtained by means of correcting with IL.$\theta_{XF}$ on the read value of the off-axis exclusive interferometer LW$_{OF}$ using the distance IL between the laser beams LWX and LW$_{OF}$. As a result, it becomes possible to use the read values of the exposing interferometer LWX and the off-axis exclusive interferometer LW$_{OF}$ as they are during exposure.

Next, the measured data D$_{xn}$, D$_{yn}$ represents only the relative error between the wafer coordinate system and the reticle coordinate system. Accordingly, when the least square approximation is performed using the wafer coordinate system as a reference, the obtained parameters RX, Ry, $\theta$, $\omega$, Ox and Oy are all represented as the linear errors of the reticle coordinate system with the wafer coordinate system as the reference. With this respect, let the x and y coordinates of the reticle coordinate system be r$_{xn}$' and r$_{yn}$', respectively, the reticle may be driven according to a fresh coordinates (r$_{xn}$', r$_{yn}$') obtained, depending on the movement of the wafer coordinate system, by the following equation:

$$\begin{bmatrix} rxn \\ ryn \end{bmatrix} = \begin{bmatrix} Rx & -Rx \cdot (\omega + \theta) \\ Ry \cdot \theta & Ry \end{bmatrix} \begin{bmatrix} rxn' \\ ryn' \end{bmatrix} + \begin{bmatrix} Ox \\ Oy \end{bmatrix}. \quad \text{(Equation 11)}$$

In this processing, the offsets Ox and Oy has already been corrected at the reticle side, so that only the offset of (<Ax>, <Ay>) is required to be corrected as the base line amount. In addition, when the reticle coordinate system is used as the reference, the results are all reversed and correction may be made on the wafer coordinate system. These corrections may be controlled separately by means of correcting on the wafer coordinate system during the rough alignment and correcting on the reticle coordinate system during the fine alignment.

As mentioned above, according to the present invention, the reticle alignment and check of the base line amount are made during a single alignment using a plurality of marks, so that it becomes possible to average the writing error of the reticle and the positioning error between the reticle and the wafer. This improves the accuracy of alignment. In addition, these processes are simultaneously performed in parallel, improving the throughput of the operation. Further, there is no error due to the air fluctuation of the optical path of the interferometers because the reference mark plate 6 is applied that is capable of measuring the reference marks at the same time in the non-scanning direction (X direction).

However, the reference mark plate 6 moves stepwise in the scanning direction and there may be an effect of the air fluctuation. With this respect, the position of the wafer stage (Z$\theta$-axis driving stage 4 or the like) is locked to check the reticle alignment and the base line amount by using the output values of the photosensitive devices 55X and 55Y in processing with the LIA optical system 52 in FIG. 13 for checking the base line amount. This minimizes the effect of the air fluctuation. In addition, the reticle marks in this embodiment are arranged at eight positions on the four corners of the reticle 12. This is because the parameters Rx, Ry, $\theta$ and $\omega$ are necessary as well as the offsets to check the relation between the reticle coordinate system and the wafer coordinate system and thus it is more advantageous to determine the parameters Ry, $\theta$ and $\omega$ with the marks arranged at four corners. Further, that is because, when the reference mark plate 6 used is a light emitting type, it is difficult to emit light from entire surface on the reference mark plate 6 due to limitation on a light emitting portion.

In addition, let the number of the reticle marks on the reticle 12 be n, then the offset parameters Ox and Oy are averaged into 1/n$^{1/2}$, and errors in the other parameters become small. Accordingly, the more the number n of the reticle marks, the smaller the error is. A simulation result on the relation among the number n of the reticle marks, the error in the parameters and the error in the base line amount is set forth below. In the following, distribution at four corners on the fresh coordinate system of (Equation 11) is represented as three times as large as a standard deviation $\sigma$ with a unit of [nm].

TABLE 1

| Number n of Reticle Marks Axis of Coordinates | Error in RX,Ry,$\theta$,$\omega$ | | Error in Base Line Amount | | Worse Square Sum |
|---|---|---|---|---|---|
| | X | Y | X | Y | |
| 4 | 9.59 | 10.96 | 8.8 | 7.2 | 16.00 |
| 8 | 7.10 | 7.92 | 6.2 | 5.1 | 9.43 |
| 12 | 5.86 | 6.48 | 5.1 | 4.2 | 7.77 |
| 16 | 5.03 | 5.80 | 4.4 | 3.6 | 6.83 |

It is revealed from the above that the number n of the reticle marks being equal to eight makes it possible to ensure the check accuracy on the base line amount and the reticle alignment of 10 nm or less even when the reticle writing error is 50 nm and the stepping error of the stage is 10 nm. In other words, the higher accuracy may be achieved by means of increasing the number n of the reticle marks with the processing speed increased within the limitation of the reference mark plate 6 of the light emitting type.

In such a case, a patterning error on the reference mark plate 6 and a distortion error of the projection optical system 8 are left as the errors in the fresh coordinate system. However, there is no trouble at all when exposure results are compared with reference data in adjusting the device and the results obtained are eliminated as system offsets because these errors are hardly fluctuated.

In the above mentioned embodiment, on the reference mark plate 6 provided are a plurality of reference marks 35A, 35B, 35C and 35D and a plurality of reference marks 37A, 37B, 37C and 37D as shown in FIG. 8C. However, the corresponding relation between the reticle coordinate system and the wafer coordinate system may be obtained by means of, for example, scanning only the reticle 12 by using a single reference mark 35A and a single reference mark 37A, thereby averaging or least square approximating the measured results. This approach also contributes to reduce the effect of the writing error of the patterns on the reticle 12.

Figure 16:
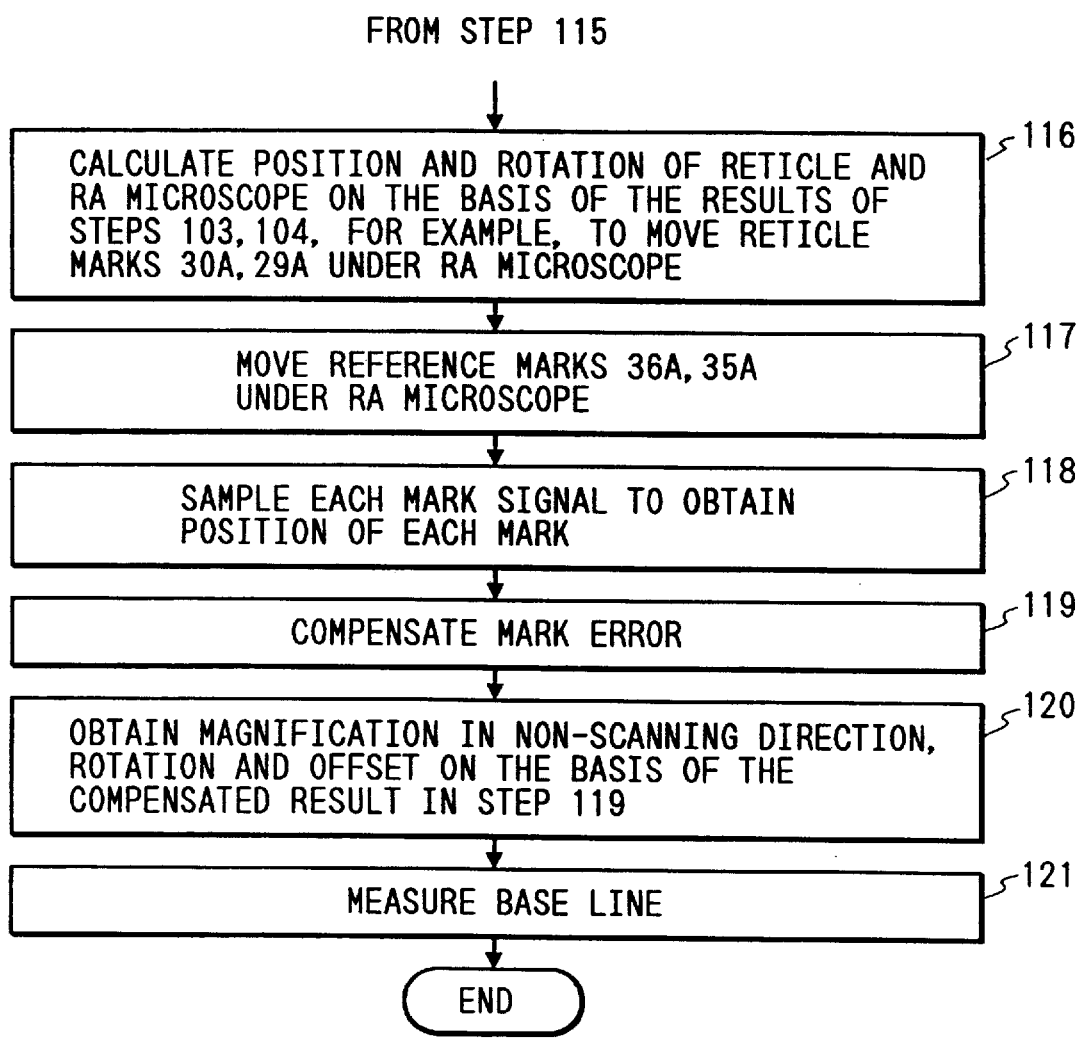
FIG. 16 is a flow chart illustrating a remaining part of the operation of the alignment method and the base line amount check method according to the second embodiment.

Next, a second embodiment of the present invention is described in conjunction with flow charts illustrated in FIGS. 15A, 15B and 16. As for this, the reticle alignment mode in the above mentioned first embodiment is based on the fine alignment using four pairs of fine alignment marks 29A, 29B, 29C, 29D, 30A, 30B, 30C and 30D on the reticle.

However, a single pair of fine alignment marks may be used for the reticle alignment or the base line measurement after the reticle alignment is once performed finely by means of the method described in the first embodiment if the scaling error in the scanning direction or the parallelism between the reticle coordinate system and the wafer coordinate system are small. Such an alignment mode for measuring on three items: measuring a magnification (Rx) in the non-scanning direction, measuring rotation (θ) and measuring the base line using the single pair of alignment mark is referred to as a quick mode. In this quick mode, it is necessary to store the writing error between the marks 29A and 30A obtained in the fine alignment sequence to correct the writing error between the fine alignment marks 29A and 30A.

Operation of this second embodiment is described with reference to FIGS. 15A, 15B and 16. Operation in FIGS. 15A, 15B and 16 is the operation of FIGS. 2A and 2B with the addition of the quick mode, in which switching between the fine mode and the quick mode can be available. At steps in FIGS. 15A and 15B, steps corresponding to those in FIGS. 2A and 2B are indicated by like reference numerals, and detailed description thereof will be omitted.

In FIGS. 15A and 15B, at steps 101 through 104, the reticle 12 is mounted on the reticle holder and positions of the rough searching alignment marks 27 and 28 are detected through the RA microscopes 19 and 20, respectively, as in the case of FIGS. 2A and 2B. Subsequently, either one of the fine mode or the quick mode is selected at step 115. The selected result is previously indicated by an operator through the keyboard 22C in FIG. 1. It is noted that pattern information or the like on the reticle 12 may be read by using a bar-code reader or the like which is not shown, according to which the main control system 22A may automatically select the alignment mode.

When the fine mode is selected, steps 105 through 113 are executed and the base line measurement is performed as described above by using measured result on the reticle alignment and the fine alignment using a plurality of fine alignment marks and a plurality of reference marks. At step 114, obtained is the writing error (hereinafter, referred to as "mark error") between the positions of the actual fine alignment marks 29A and 30A relative to the target positions on the fresh coordinate system on the reticle. The mark error is memorized in a memorizing unit in the main control system 22A. In calculating the mark error, the reticle coordinate system is obtained with the wafer coordinate system used as the reference according to the relation (conversion parameters) obtained at step 113. On this reticle coordinate system, the nonlinear error is obtained on the measured coordinate values relative to the coordinate values in design on the fine alignment marks 29A, 29B, 29C, 29D, 30A, 30B, 30C and 30D. This nonlinear error corresponds to the mark error. In this way, the mark error on the fresh coordinate system on the reticle is memorized according to the results obtained at steps 112 and 113. In addition, if the reticle writing error is previously measured, an operator may enter the writing error directly. When the writing error comprises a linear component, this becomes more advantageous.

On the other hand, if the quick mode is selected at the step 115, operation proceeds to step 116 in FIG. 16. At steps 116 through 118, the same operation is executed as in the steps 105 through 107 in FIG. 1. More specifically, images of a pair of fine alignment marks 30A and 29A on the reticle and a pair of reference marks 36A and 35A are observed through the RA microscopes to detect a single reference mark 37A by using the alignment device 34 of the off-axis type. In addition, at later half of step 119, the positions of the marks observed through the RA microscope and the mark detected by the alignment device 34 of the off-axis type are obtained. Subsequently, at step 119, the mark error obtained at step 114 in FIG. 15B is corrected relative to the position detected on the fine alignment marks 30A and 29A on the reticle 12. As a result, the writing error of the patterns on the reticle 12 can be corrected or compensated to the similar degree to the case of the fine alignment mode in the first embodiment even if the number of the marks measured in the quick mode is small.

Next, at step 120, the magnification error Rx in the non-scanning direction, the rotation θ and the offsets Ox, Oy are obtained of six conversion parameters (Rx, Ry, θ, ω, Ox, Oy) in Equation 9 according to the position of each mark obtained as a result of correction at the step 119. More specifically, as shown in FIGS. 8A and 8C, the magnification error Rx in the non-scanning direction is obtained from the difference between the distance between the marks in the X direction (non-scanning direction) of the measured reference marks 35A and 36A and the distance between the mark images 29A and 30A in the X direction. In addition, the rotation θ is obtained from a difference between a displacement between the reference marks 35A and 36A in the Y direction (scanning direction) and a displacement between the mark images 29A and 30A in the Y direction and the mark distance. The offsets Ox, Oy can be given according to a mean displacement between the mark images of the reference mark and the reticle mark.

In the quick mode, the number of marks to be measured is two by each at the reticle side and the reference mark plate 6 side, so that only four out of six conversion parameters in Equation 9 are determined. The four conversion parameters are thus obtained as mentioned above. A scaling error Ry in the scanning direction may be obtained by means of selecting, as the marks to be measured, two fine alignment marks 29A and 29D aligned in the Y direction in FIGS. 4A to 4C and two reference marks 35A and 35D in FIG. 8C.

The reticle alignment is performed according to the magnification error Rx in the non-scanning direction, the rotation θ and the offsets Ox and Oy obtained at the step 120. The measurement of the magnification error Rx may be made by means of preparing as a table the magnification error Rx corresponding to the difference in the measured values on the marks from the designed values, thereby the magnification error Rx may be obtained with the difference between the measured values on the marks and the designed values on the marks being applied to the table.

Next, at step 121, the base line measurement is performed by using the measured values on the central coordinate of the reference marks 35A and 36A as well as the measured value on the reference mark 37A.

In this way, according to this embodiment, when the fine alignment mode is once performed to obtain the writing error (mark error) on the patterns of the reticle 12 and then the alignment is performed at the quick mode, the error is corrected, so that the alignment of the projection type exposure apparatus of the slit scanning type can be made at a high throughput and with a high accuracy.

Next, a third embodiment of the present invention is described in conjunction with a flow chart illustrated in FIG. 17. This third embodiment is a case where the reticle alignment and the base line measurement are performed in the above mentioned quick mode for every one replacement of a predetermined number of wafers, i.e., for every exposure of the predetermined number of wafers. In this embodiment, described with reference to FIG. 17 is an exemplified operation in a case where the reticle is exchanged in the projection type exposure apparatus in FIG.

1, following which the patterns of the reticle 12 are successively exposed on the wafers of which number is equal to, for example, 100.

First, at step 211 in FIG. 17, the previously used reticle is replaced by the reticle 12 in FIG. 1 for starting the exposing operation. In such a case, the reticle alignment and base line check operations are performed in the quick mode that are similar to those illustrated at steps 101 through 104 and 115 in FIG. 15A and steps 116 through 121 in FIG. 16. Thereafter, the number of wafers to be exposed until the next reticle alignment and the base line check is set as an initial value of a variable N at step 212. At step 213, the wafer is loaded on the wafer stage 4. When there is any wafer already exposed at step 213, the exposed wafer is first unloaded and then a new wafer is loaded.

Subsequently, at step 214, it is determined whether the variable N is equal to zero, i.e., whether the reticle alignment and the base line check should be performed at that timing. If the variable N is larger than zero, one is subtracted from the variable N at step 215 to proceed to step 216. At the step 216, the wafer is aligned by using the alignment device 34 of the off-axis type shown in FIG. 13 or the alignment system of the TTL type, following which the patterns of the reticle 12 are exposed on each shot of the wafer. After completion of exposure of all (designated number of) wafers, the exposing process on that reticle 12 is ended. If there are one or more wafers left unexposed, the step 213 is again executed to unload the exposed wafer and load a new wafer. This step is followed by the step 214.

If the variable N is equal to zero, i.e., whether the reticle alignment and the base line check should be performed at that timing at the step 214, the rotation error and the magnification error of the reticle 12 are measured at step 217. This corresponds to the step 120 in FIG. 16. Subsequently, step 218 is carried out to perform the base line check in the X and Y directions of the alignment device 34 of the off-axis type (the alignment system comprising the FIA optical system 48 or the wafer alignment system of a two-beam interference alignment type comprising the LIA optical system 52). Thereafter, the number of the wafers to be exposed until the next base line check is set as the variable N at step 219, which returns the operation to the step 216.

As mentioned above, according to this invention, the reticle alignment and the base line measurement are performed for every replacement of the reticle, and the reticle alignment and the base line measurement are performed in the quick mode for every exposure of the predetermined number of wafers. Accordingly, it is possible to increase an overlay accuracy between the images of the wafer and the reticle at a high throughput.

While the technique in the above mentioned embodiment has thus been described in conjunction with the base line measurement with the alignment device of the off-axis type used, equivalent effects can be obtained by applying the present invention to a TTL (through the lens) type using within the field of the projection optical system.

It should be understood that the present invention is not limited to the particular embodiment shown and described above, and various changes and modifications may be made without departing from the spirit and scope of the appended claims.

What is claimed is:

1. A position measuring method comprising the steps of:
moving a mask, provided with a plurality of marks, a substrate on which a pattern of said mask is exposed, in a movement direction by a predetermined amount to obtain information with respect to a displacement between said plurality of marks and a reference mark provided on a substrate stage which moves a substrate which is exposed with an image of a pattern formed on said mask; and
obtaining information with respect to a position of said mask in a stage coordinate system based on said information with respect to said displacement.

2. A position measuring method according to claim 1, wherein said movement direction is a predetermined direction as a scanning direction in which said mask and said substrate are synchronously moved to expose said substrate with the image of said pattern formed on said mask.

3. A position measuring method according to claim 2, wherein said plurality of marks comprise at least two sets of marks, each set of marks being arranged in a direction perpendicular to said movement direction, and wherein said reference mark comprises a plurality of reference marks arranged in the direction perpendicular to said movement direction.

4. A scanning exposure method which transfers a pattern of a mask onto a substrate while moving said mask and said substrate synchronously in a scanning direction, comprising the steps of:
providing a relative movement between a stage for holding said substrate and said mask in said scanning direction to obtain a displacement amount between a reference mark provided on said stage and an alignment mark provided on said mask; and
detecting, based on said displacement amount, an inclination between a movement direction of said mask and a movement direction of said reference mark.

5. An exposure method which transfers a pattern of a mask onto a substrate, comprising:
a first step of providing a relative movement between a stage for holding said substrate and said mask to detect a detection mark provided on said stage and an alignment mark provided on said mask;
a second step of detecting said detection mark with an alignment system without said mask; and
a third step of obtaining a positional relationship between said mask and said alignment system based on detected results in said first and second steps.

6. An exposure method which transfers a pattern of a mask onto a substrate while providing synchronized movement of said mask and said substrate, comprising the steps of:
providing a relative movement between a stage for holding said substrate and said mask to detect a reference mark arranged on a reference plate which is provided on said stage and is different from said substrate, and an alignment mark provided on said mask; and
obtaining a positional relationship between said reference mark and said alignment mark.

7. An exposure apparatus which transfers a pattern of a mask onto a substrate while providing synchronized movement of said mask and said substrate, comprising:
a first position measuring system which measures a position of said mask;
a second position measuring system which measures a position of said substrate;
a first detecting system which detects a mark on said mask;
a substrate stage which carries said substrate thereon;
a second detecting system which detects a reference mark provided on said substrate stage; and a control system which obtains a corresponding relationship between a coordinate system defined by said first position measuring system and a coordinate system defined by said second position measuring system, based on detected results of said first and second detecting systems which are obtained when said mask and substrate are moved at least in a direction of said synchronized movement.

8. An exposure method which transfers a pattern of a mask onto a substrate while providing synchronized movement of said mask and said substrate, comprising the steps of:

measuring a position of said mask with a first position measuring system;

measuring a position of said substrate with a second position measuring system;

detecting a measuring mark on said mask;

detecting a reference mark provided on a substrate stage which carries said substrate thereon; and obtaining a corresponding relationship between a coordinate system defined by said first position measuring system and a coordinate system defined by said second position measuring system, based on detected results of said measuring mark and said reference mark which are obtained when said mask and substrate are moved at least in a direction of said synchronized movement.

9. An exposure method which transfers a pattern of a mask onto a substrate while providing synchronized movement of said mask and said substrate, comprising:

a first step of providing relative movement between a plurality of measuring marks provided on said mask and a reference mark provided, in correspondence with said plurality of measuring marks, on a substrate stage which carries said substrate thereon to detect a positional relationship between said measuring marks and said reference mark;

a second step of detecting a positional relationship between a part of said plurality of measuring marks and said reference mark; and a third step of obtaining a relationship between a coordinate system of said mask and a coordinate system of said substrate stage based on a part of a detected result of said first step and a detected result of said second step.

10. An exposure method according to claim 9, wherein said second step includes detecting a rotation of said mask and a magnification error of said mask with respect to a direction perpendicular to said relative movement between said plurality of measuring marks and said reference mark.

11. An exposure method which transfers a pattern of a mask onto a substrate while providing synchronized movement of said mask and said substrate, comprising:

a first step of providing relative movement between a plurality of measuring marks provided on said mask and a detection mark provided, in correspondence with said plurality of measuring marks, on a substrate stage which carries said substrate thereon to detect a positional relationship between said measuring marks and said detection mark;

a second step of detecting a positional relationship between a part of said plurality of measuring marks and said detection mark;

a third step of detecting said detection mark by an alignment sensor without said mask; and a step of obtaining a positional relationship between an exposing position of said mask and a detecting point of said alignment sensor based on a part of a detected result of said first step, a detected result of said second step and a detected result of said third step.

12. An exposure method which transfers a pattern of a mask onto a substrate, comprising the steps of:

detecting a plurality of marks provided on said mask to obtain a writing error of said mask; and storing said writing error.

13. An exposure method according to claim 12, further comprising the step of:

detecting both said plurality of marks and a reference mark provided on a stage, wherein said writing error is obtained based on a nonlinear component of positional errors of said reference mark and said plurality of marks.

14. An exposure method which transfers a pattern of a mask onto a substrate while providing synchronized movement between said mask and said substrate, comprising the steps of:

providing relative movement between said mask and a stage for holding said substrate in a direction of said synchronized movement to obtain information with respect to a displacement between a plurality of marks and a reference mark on said stage; and comparing said information with respect to said displacement with a design value to obtain, based on a comparison result, information with respect to a position of said mask in a stage coordinate system.

15. An exposure method according to claim 14, further comprising the step of:

obtaining said information with respect to said position of said mask where a difference between said information with respect to said displacement and said design value is minimized.

16. An exposure method according to claim 14, further comprising the step of:

comparing said information with respect to said displacement with said design value to calculate information with respect to at least one of rotation, magnification, offset, and rectangular degree.

17. A scanning exposure method comprising the steps of:

detecting information with respect to positions of a plurality of reference marks provided on a stage which carries a substrate thereon; and comparing said information with respect to said positions with a design value to calculate information with respect to at least one of rotation, magnification, offset, and rectangular degree.

18. An exposure method of transferring a pattern onto a substrate by illuminating a mask having said pattern to be transferred onto said substrate and by synchronously scanning said mask and said substrate, comprising the steps of:

providing relative movement, in a direction of said scanning, between a plurality of measuring marks provided on said mask along said direction of said scanning and a plurality of reference marks provided, in correspondence with said measuring marks, on a stage which moves said substrate, to obtain information with respect to positions of said measuring marks and said reference marks; and obtaining a corresponding relationship between a coordinate system on said mask and a coordinate system on said stage based on said information with respect to said positions.

19. An exposure method according to claim 18, further comprising the step of:

moving said plurality of measuring marks and said plurality of reference marks in a direction of said scanning by respective predetermined amounts to measure a displacement between said measuring marks and said reference marks sequentially.

20. An exposure method according to claim 18, further comprising the step of:

transferring said pattern onto said substrate through a projection optical system.

21. An exposure method of transferring a pattern of a mask within an illumination area formed in a predetermined shape onto a substrate on a stage by illuminating said illumination area formed in said predetermined shape with a predetermined energy beam, comprising the steps of:

providing a relative movement between a plurality of measuring marks provided on said mask and a reference mark provided, in correspondence with a part of said measuring marks, on said stage, to obtain information with respect to positions of said measuring marks and said reference mark;

obtaining a hypothetical coordinate system on said mask based on a coordinate system on said mask and said information with respect to said positions; and obtaining a writing error of said measuring marks based on said hypothetical coordinate system.

22. An exposure method according to claim 21, further comprising the step of:

obtaining said writing error by using said coordinate system on said mask, said information with respect to said positions and said hypothetical coordinate system.

23. An exposure method according to claim 21, further comprising the step of:

obtaining said hypothetical coordinate system by performing a least square approximation by using said coordinate system on said mask and said information with respect to said positions.

24. An exposure method according to claim 21, wherein said information with respect to said positions is a displacement amount between said measuring marks and said reference mark, and said exposure method further comprises the step of obtaining said writing error by subtracting said hypothetical coordinate system from said coordinate system on said mask and said displacement amount.

25. An exposure method according to claim 21, further comprising the step of:

correcting said writing error of said measuring marks to obtain a corresponding relationship between said coordinate system on said mask and a coordinate system on said stage.

26. A scanning exposure method which moves a mask and a substrate synchronously in a respective scanning direction for a scanning exposure, the method comprising the steps of:

relatively moving a mask stage for holding said mask and a substrate stage for holding said substrate in the scanning direction to detect a positional relationship between a first mark on said mask stage and a second mark on said substrate stage, said second mark being provided on a position different from said substrate; and exposing said substrate with an image of a pattern formed on said mask based on the detected positional relationship.

27. A scanning exposure method according to claim 26, wherein said first mark is formed on a member and provided on said mask stage through this member.

28. A scanning exposure method according to claim 27, wherein the member upon which said first mark is formed is said mask.

29. A scanning exposure method according to claim 28, further comprising:

detecting information with respect to a rotation error of said mask based on the detected positional relationship.

30. A scanning exposure method according to claim 28, further comprising:

detecting information with respect to a magnification error of said mask in a direction perpendicular to the scanning direction of said mask for said scanning exposure based on the detected positional relationship.

31. A scanning exposure method according to claim 28, further comprising:

obtaining positional information of said mask based on said detected positional relationship.

32. A scanning exposure method according to claim 27, wherein said mask stage and said substrate stage are stopped during a detection of said positional relationship.

33. A method which manufactures semiconductor devices using the scanning exposure method of claim 27.

34. A scanning exposure method according to claim 27, wherein the relative movement between said mask stage and said substrate stage is provided by moving only said mask stage in said scanning direction.

35. A scanning exposure method which moves a mask and a substrate synchronously in a respective scanning direction for a scanning exposure, the method comprising the steps of:

detecting a positional relationship between first marks on said mask stage and a second mark on said substrate stage, said first marks being formed along the scanning direction of the mask, said second mark being provided on a position different from said substrate; and exposing said substrate with an image of a pattern formed on said mask based on the detected positional relationship.

36. A scanning exposure method according to claim 35, wherein said first marks are formed on a member and provided on said mask stage through this member.

37. A scanning exposure method according to claim 36, wherein the member upon which said first marks are formed is said mask.

38. A scanning exposure method according to claim 37, further comprising:

detecting information with respect to a rotation error of said mask based on the detected positional relationship.

39. A scanning exposure method according to claim 37, further comprising:

detecting information with respect to a magnification error of said mask in a direction perpendicular to the scanning direction of said mask for said scanning exposure based on the detected positional relationship.

40. A scanning exposure method according to claim 35, wherein said second mark comprises a plurality of marks arranged in the scanning direction of said substrate corresponding to said first marks.

41. A scanning exposure method according to claim 35, further comprising:

detecting a positional relationship between part of said first marks and said second mark, wherein said exposing step exposes said substrate with the image of the pattern of said mask based on the detected positional relationship between said first marks and said second mark and the detected positional relationship between said part of said first marks and said second mark.

42. A scanning exposure method according to claim 35, further comprising:

obtaining positional information of said mask based on said detected positional relationship.

43. A method which manufactures semiconductor devices using the scanning exposure method of claim 35.

44. A scanning exposure method which moves a mask and a substrate synchronously in a respective scanning direction for a scanning exposure, the method comprising the steps of:

detecting a positional relationship between a first mark on a mask stage for holding said mask and a second mark on a substrate stage for holding said substrate; and obtaining a relationship between a coordinate system on a side of said mask and a coordinate system on a side of said substrate based on the detected positional relationship.

45. A scanning exposure method according to claim 44, wherein said first mark is formed on a member and provided on said mask stage through this member.

46. A scanning exposure method according to claim 45, wherein the member upon which said first mark is formed is said mask.

47. A scanning exposure method according to claim 44, further comprising:

obtaining a writing error of said first mark based on said obtained relationship.

48. A scanning exposure method according to claim 44, wherein said step of detecting said positional relationship includes:

relatively moving said mask stage and said substrate stage in the scanning direction for the scanning exposure to detect the positional relationship between said first mark and said second mark.

49. A scanning exposure method according to claim 44, wherein said first mark comprises a plurality of marks arranged in the scanning direction of the mask.

50. A scanning exposure method according to claim 49, wherein said second mark comprises a plurality of marks arranged in the scanning direction of said substrate corresponding to the plurality of first marks.

51. A scanning exposure method according to claim 44, wherein said obtained relationship comprises a scaling datum in the scanning direction.

52. A scanning exposure method according to claim 44, wherein said obtained relationship comprises a parallel datum in the scanning direction.

53. A scanning exposure method according to claim 44, wherein said obtained relationship comprises an offset datum.

54. A scanning exposure method according to claim 44, further comprising:

obtaining a new coordinate system on the side of said mask based on said obtained relationship.

55. A scanning exposure method according to claim 44, wherein said coordinate system on the side of said mask is defined by a first interferometer to measure a position of said mask and said coordinate system on the side of said substrate is defined by a second interferometer to measure a position of said substrate.

56. A scanning exposure method which moves a mask and a substrate synchronously in a respective scanning direction relative to a projection optical system for a scanning exposure, the method comprising the steps of:

detecting a positional relationship between a first mark on a mask stage for holding said mask and a second mark on a substrate stage for holding said substrate; and determining, based on the detected positional relationship, a positional relationship between a reference point within an exposing field of said projection optical system and a detection center of an alignment system which detects a mark on said substrate.

57. A scanning exposure method according to claim 56, wherein said first mark is formed on a member and provided on said mask stage through this member.

58. A scanning exposure method according to claim 57, wherein the member upon which said first mark is formed is said mask.

59. A scanning exposure method according to claim 56, wherein said step of detecting said positional relationship includes:

relatively moving said mask stage and said substrate stage in the scanning direction for the scanning exposure to detect the positional relationship between said first mark and said second mark.

60. A scanning exposure method according to claim 56, wherein said first mark comprises a plurality of marks arranged in the scanning direction of the mask.

61. A scanning exposure method according to claim 60, wherein said second mark comprises a plurality of marks arranged in the scanning direction of said substrate corresponding to the plurality of first marks.

62. A scanning exposure method according to claim 56, wherein said detection center of the alignment system is distant from said reference point within the exposing field in the scanning direction of said substrate.

63. A method which manufactures semiconductor devices using the scanning exposure method of claim 56.

64. A scanning exposure method which moves a mask and a substrate synchronously in a respective scanning direction for a scanning exposure, the method comprising the steps of:

relatively moving a mask stage for holding said mask and a substrate stage for holding said substrate in the scanning direction for the scanning exposure to detect a positional relationship between a first mark on said mask stage and a second mark on said substrate stage; and obtaining a relationship between the scanning direction of said mask stage and the scanning direction of said substrate stage based on the detected positional relationship.

65. A scanning exposure method according to claim 64, wherein said first mark is formed on a member and provided on said mask stage through this member.

66. A scanning exposure method according to claim 65, wherein the member upon which said first mark is formed is said mask.

67. A scanning exposure method according to claim 64, wherein said first mark comprises a plurality of marks arranged in the scanning direction of the mask.

68. A scanning exposure method according to claim 67, wherein said second mark comprises a plurality of marks arranged in the scanning direction of said substrate corresponding to the plurality of first marks.

69. A method which manufactures semiconductor devices using the scanning exposure method of claim 64.

70. A scanning exposure method which moves a mask and a substrate synchronously in a respective scanning direction for a scanning exposure, the method comprising, with a plurality of first marks on a mask stage for holding said mask and a second mark on a substrate stage for holding said substrate, the steps of:

selecting one of a first mode and a second mode, said first mode detecting a positional relationship between said plurality of first marks and said second mark, and said second mode detecting a positional relationship between part of said plurality of first marks and said second mark; and exposing said substrate with an image of a pattern formed on said mask based on the detected positional relationship by the selected mode.

71. A scanning exposure method according to claim 70, wherein said first marks are formed on a member and provided on said mask stage through this member.

72. A scanning exposure method according to claim 71, wherein the member upon which said first marks are formed is said mask.

73. A scanning exposure method according to claim 70, wherein:

said first mode relatively moves said mask stage and said substrate stage in said scanning direction to detect a positional relationship between said plurality of first marks and said second mark, and said second mode detects a positional relationship between part of said plurality of first marks and said second mark without moving said mask stage and said substrate stage.

74. A scanning exposure method according to claim 70, wherein:

said second mark comprises a plurality of marks corresponding to said plurality of first marks, and a positional relationship between part of said plurality of first marks and part of said plurality of second marks is detected in said second mode.

75. A method which manufactures semiconductor devices using the scanning exposure method of claim 70.

76. A scanning exposure apparatus which moves a mask and a substrate synchronously in a respective scanning direction for a scanning exposure, the apparatus comprising:

a mask stage which holds said mask;

a substrate stage which holds said substrate;

a detector, associated with said mask stage and said substrate stage, which detects a positional relationship between a first mark on said mask stage and a second mark on said substrate stage, said second mark being provided on a position different from said substrate; and a controller, connected to said mask stage, said substrate stage and said detector, which moves said mask stage and said substrate stage relatively in the scanning direction to detect said positional relationship by said detector.

77. A scanning exposure apparatus which moves a mask and a substrate synchronously in a respective scanning direction for a scanning exposure, the apparatus comprising:

a mask stage which holds said mask;

a substrate stage which holds said substrate;

a detector, associated with said mask stage and said substrate stage, which detects a positional relationship between first marks on said mask stage and a second mark on said substrate stage, said first marks being formed along the scanning direction of the mask, said second mark being provided on a position different from said substrate.

78. A scanning exposure apparatus which moves a mask and a substrate synchronously in a respective scanning direction for a scanning exposure, the apparatus comprising:

a mask stage which holds said mask;

a substrate stage which holds said substrate;

a detector, associated with said mask stage and said substrate stage, which detects a positional relationship between a first mark on said mask stage and a second mark on said substrate stage; and a controller, connected to said detector, which obtains a relationship between a coordinate system on a side of said mask and a coordinate system on a side of said substrate based on the positional relationship detected by said detector.

79. A scanning exposure apparatus which moves a mask and a substrate synchronously in a respective scanning direction for a scanning exposure, the apparatus comprising:

a mask stage which holds said mask;

a substrate stage which holds said substrate;

a projection optical system, disposed between said mask and said substrate, which projects an image of a pattern on said mask onto said substrate;

a detector, associated with said mask stage and said substrate stage, which detects a positional relationship between a first mark on said mask stage and a second mark on said substrate stage;

an alignment system, associated with said substrate stage, which detects a mark on said substrate held by said substrate stage; and a controller, connected to said detector, which determines a positional relationship between a reference point within an exposing field of said projection optical system and a detection center of said alignment system based on the positional relationship detected by said detector.

80. A scanning exposure apparatus which moves a mask and a substrate synchronously in a respective scanning direction for a scanning exposure, the apparatus comprising:

a mask stage which holds said mask;

a substrate stage which holds said substrate;

a detector, associated with said mask stage and said substrate stage, which detects a positional relationship between a first mark on said mask stage and a second mark on said substrate stage; and a controller, connected to said detector, said mask stage and said substrate stage, which moves said mask stage and said substrate stage relatively in the scanning direction to detect said positional relationship by said detector, and which obtains a relationship between the scanning direction of said mask stage and the scanning direction of said substrate stage based on the positional relationship detected by said detector.

81. A scanning exposure apparatus which moves a mask and a substrate synchronously in a respective scanning direction for a scanning exposure, the apparatus comprising:

a mask stage which holds said mask;

a substrate stage which holds said substrate;

a projection optical system, disposed between said mask and said substrate, which projects an image of a pattern on said mask onto said substrate; and an alignment system, associated with said substrate stage, which detects an alignment mark on said substrate held by said substrate stage, and wherein a detection center of said alignment system is apart from a reference point in an exposure field of said projection optical system in the scanning direction of said substrate.

82. A scanning exposure apparatus according to claim 81, further comprising:

a detector, associated with said mask stage and said substrate stage, which detects a positional relationship between a first mark on said mask stage and a second mark on said substrate stage, and wherein a positional relationship between the reference point and the detection center is determined based on the positional relationship detected by said detector.

83. A method for making a scanning exposure apparatus which moves a mask and a substrate synchronously in a respective scanning direction for a scanning exposure, the method comprising the steps of:

providing a mask stage which holds said mask;

providing a substrate stage which holds said substrate;

providing a detector, associated with said mask stage and said substrate stage, which detects a positional relationship between a first mark on said mask stage and a second mark on said substrate stage, said second mark being provided on a position different from said substrate; and providing a controller, connected to said mask stage, said substrate stage and said detector, which moves said mask stage and said substrate stage relatively in the scanning direction to detect said positional relationship by said detector.

84. A method according to claim 83, wherein said first mark is formed on a member and provided on said mask stage through this member.

85. A method according to claim 84, wherein the member upon which said first mark is formed is said mask.

86. A method according to claim 83, wherein the relative movement between said mask stage and said substrate stage is provided by moving only said mask stage.

87. A method according to claim 83, wherein said mask stage and said substrate stage are stopped during a detection of said detector.

88. A method for making a scanning exposure apparatus which moves a mask and a substrate synchronously in a respective scanning direction for a scanning exposure, the method comprising the steps of:

providing a mask stage which holds said mask;

providing a substrate stage which holds said substrate;

providing a detector, associated with said mask stage and said substrate stage, which detects a positional relationship between first marks on said mask stage and a second mark on said substrate stage, said first marks being formed along the scanning direction of the mask, said second mark being provided on a position different from said substrate.

89. A method according to claim 88, wherein said first marks are formed on a member and provided on said mask stage through this member.

90. A method according to claim 89, wherein the member upon which said first marks are formed is said mask.

91. A method according to claim 88, wherein said second mark comprises a plurality of marks arranged in the scanning direction of said substrate corresponding to the plurality of first marks.

92. A method for making a scanning exposure apparatus which moves a mask and a substrate synchronously in a respective scanning direction for a scanning exposure, the method comprising the steps of:

providing a mask stage which holds said mask;

providing a substrate stage which holds said substrate;

providing a detector, associated with said mask stage and said substrate stage, which detects a positional relationship between a first mark on said mask stage and a second mark on said substrate stage; and providing a controller, connected to said detector, which obtains a relationship between a coordinate system on a side of said mask and a coordinate system on a side of said substrate based on the positional relationship detected by said detector.

93. A method according to claim 92, wherein said first mark is formed on a member and provided on said mask stage through this member.

94. A method according to claim 93, wherein the member upon which said first mark is formed is said mask.

95. A method according to claim 92, wherein said first mark comprises a plurality of marks arranged in the scanning direction of the mask; and said second mark comprises a plurality of marks arranged in the scanning direction of said substrate corresponding to the plurality of first marks.

96. A method according to claim 92, wherein said controller is connected to said mask stage and said substrate stage and said controller moves said mask stage and said substrate stage relatively in the scanning direction to detect said positional relationship by said detector.

97. A method of making a scanning exposure apparatus which moves a mask and a substrate synchronously in a respective scanning direction for a scanning exposure, the method comprising the steps of:

providing a mask stage which holds said mask;

providing a substrate stage which holds said substrate;

providing a projection optical system, disposed between said mask and said substrate, which projects an image of a pattern on said mask onto said substrate;

providing a detector, associated with said mask stage and said substrate stage, which detects a positional relationship between a first mark on said mask stage and a second mark on said substrate stage;

providing an alignment system, associated with said substrate stage, which detects a mark on said substrate held by said substrate stage; and providing a controller, connected to said detector, which determines a positional relationship between a reference point within an exposing field of said projection optical system and a detection center of said alignment system based on the positional relationship detected by said detector.

98. A method according to claim 97, wherein said first mark is formed on a member and provided on said mask stage through this member.

99. A method according to claim 98, wherein the member upon which said first mark is formed is said mask.

100. A method according to claim 97, wherein said first mark comprises a plurality of marks arranged in the scanning direction of the mask; and said second mark comprises a plurality of marks arranged in the scanning direction of said substrate corresponding to the plurality of first marks.

101. A method according to claim 97, wherein said controller is connected to said mask stage and said substrate stage and said controller moves said mask stage and said substrate stage relatively in the scanning direction to detect said positional relationship by said detector.

102. A method for making a scanning exposure apparatus which moves a mask and a substrate synchronously in a respective scanning direction for a scanning exposure, the method comprising the steps of:

providing a mask stage which holds said mask;

providing a substrate stage which holds said substrate;

providing a detector, associated with said mask stage and said substrate stage, which detects a positional relationship between a first mark on said mask stage and a second mark on said substrate stage; and providing a controller, connected to said detector, said mask stage and said substrate stage, which moves said mask stage and said substrate stage relatively in the scanning direction to detect said positional relationship by said detector, and which obtains a relationship between the scanning direction of said mask stage and the scanning direction of said substrate stage based on the positional relationship detected by said detector.

103. A method according to claim 102, wherein said first mark is formed on a member and provided on said mask stage through this substrate.

104. A method according to claim 103, wherein the member upon which said first mark is formed is said mask.

105. A method according to claim 102, wherein the relative movement between said mask stage and said substrate stage is provided by moving only said mask stage.

106. A method according to claim 102, wherein said mask stage and said substrate stage are stopped during a detection of said detector.

107. An exposure method according to claim 5, wherein said detection mark comprises a plurality of reference marks, one reference mark of said plurality of reference marks is detected in said first step, and a reference mark other than that detected in said first step is detected in said second step.

108. An exposure method according to claim 11, wherein said detection mark comprises a plurality of reference marks, said plurality of reference marks are detected in said first step, part of said plurality of reference marks are detected in said second step, and a reference mark other than those detected in said first and second steps is detected in said third step.

109. A position measuring system comprising:

a mask stage which holds a mask which has a plurality of marks;

a substrate stage which holds a substrate which is exposed with an image of a pattern formed on said mask;

a controller, connected to said mask stage and said substrate stage, which moves said mask in a movement direction by a predetermined amount to obtain information with respect to a displacement between said plurality of marks and a reference mark provided on said substrate stage, and which obtains information with respect to a position of said mask in a stage coordinate system based on said information with respect to said displacement.

110. A scanning exposure apparatus which transfers a pattern of a mask onto a substrate while moving said mask and said substrate synchronously in a scanning direction, the apparatus comprising:

a mask stage which holds said mask;

a substrate stage which holds said substrate;

a controller, connected to said mask stage and said substrate stage, which provides relative movement between said substrate stage and said mask in said scanning direction to obtain a displacement amount between a reference mark provided on said stage and an alignment mark provided on said mask; and a detector, associated with said mask stage and said substrate stage, which detects, based on said displacement amount, an inclination between a movement direction of said mask and a movement direction of said reference mark.

111. An exposure apparatus, comprising:

a mask stage which holds a mask;

a substrate stage which holds a substrate;

an alignment system, associated with said substrate stage, which detects a detection mark provided on said substrate stage; and a controller, connected to said mask stage, said substrate stage and said alignment system, which provides relative movement between said substrate stage and said mask to detect said detection mark and an alignment mark provided on said mask, so as to provide a first detection result, and which detects said detection mark with said alignment system, so as to provide a second detection result, and which obtains a positional relationship between said mask and said alignment system based on said first and second detection results.

112. An exposure apparatus which transfers a pattern of a mask onto a substrate while providing synchronized movement of said mask and said substrate, the apparatus comprising:

a mask stage which holds said mask;

a substrate stage which holds said substrate; and a controller, connected to said mask stage and said substrate stage, which provides relative movement between said substrate stage and said mask to detect a reference mark arranged on a reference plate which is provided on said substrate stage and is different from said substrate, and an alignment mark provided on said mask, and which obtains a positional relationship between said reference mark and said alignment mark.

113. An exposure apparatus which transfers a pattern of a mask onto a substrate while providing synchronized movement of said mask and said substrate, the apparatus comprising:

a mask stage which holds said mask;

a substrate stage which holds said substrate; and a controller, connected to said mask stage and said substrate stage, which provides relative movement between a plurality of measuring marks provided on said mask and a reference mark provided, in correspondence with said plurality of measuring marks, on said substrate stage to detect a positional relationship between said measuring marks and said reference mark, so as to provide a first detection result, and which detects a positional relationship between a part of said plurality of measuring marks and said reference mark, so as to provide a second detection result, and which obtains a relationship between a coordinate system of said mask and a coordinate system of said substrate stage based on a part of said first detection result and said second detection result.

114. An exposure apparatus which transfers a pattern of a mask onto a substrate while providing synchronized movement of said mask and said substrate, the apparatus comprising:

a mask stage which holds said mask, said mask being provided with a plurality of measuring marks;

a substrate stage which holds said substrate and which is provided with a detection mark in correspondence with said plurality of measuring marks;

an alignment sensor, associated with said substrate stage, which detects said detection mark without said mask; and a controller, connected to said mask stage, said substrate stage and said alignment sensor, which provides relative movement between said plurality of measuring marks and said detection mark to detect a positional relationship between said measuring marks and said detection mark, so as to provide a first detection result, and which detects a positional relationship between a part of said plurality of measuring marks and said detection mark, so as to provide a second detection result, and which causes said alignment sensor to detect said detection mark, so as to provide a third detection result, and which obtains a positional relationship between an exposing position of said mask and a detecting point of said alignment sensor based on a part said first detection result, said second detection result and said third detection result.

115. An exposure apparatus which transfers a pattern of a mask onto a substrate, comprising:

a mask stage which holds said mask;

a substrate stage which holds said substrate;

a detector, associated with said mask stage and said substrate stage, which detects a plurality of marks provided on said mask to obtain a writing error of said mask; and a controller, connected to said detector, which stores said writing error.

116. A scanning exposure apparatus which transfers a pattern of a mask onto a substrate while providing synchronized movement between said mask and said substrate, the apparatus comprising:

a mask stage which holds said mask;

a substrate stage which holds said substrate;

a controller, connected to said mask stage and said substrate stage, which provides relative movement between said mask and said substrate, in a direction of said synchronized movement, to obtain information with respect to a displacement between a plurality of marks and a reference mark on said substrate stage, and which compares said information with respect to said displacement with a design value to obtain, based on a comparison result, information with respect to a position of said mask in a stage coordinate system.

117. A scanning exposure apparatus, comprising:

a mask stage which holds a mask;

a substrate stage which holds a substrate;

a detector, associated with said mask stage and said substrate stage, which detects information with respect to positions of a plurality of reference marks provided on said substrate stage; and a controller, connected to said mask stage, said substrate stage and said detector, which compares said information with respect to said positions with a design value to calculate information with respect to at least one of rotation, magnification, offset, and rectangular degree.

118. A scanning exposure apparatus which transfers a pattern onto a substrate by illuminating a mask having said pattern to be transferred onto said substrate and by synchronously scanning said mask and said substrate, the apparatus comprising:

a mask stage which holds said mask;

a substrate stage which holds said substrate; and a controller, connected to said mask stage and said substrate stage, which provides relative movement, in a direction of said scanning, between a plurality of measuring marks provided on said mask along said direction of said scanning and a plurality of reference marks provided, in correspondence with said plurality of measuring marks, on said substrate stage, to obtain information with respect to positions of said measuring marks and said reference marks, and which obtains a corresponding relationship between a coordinate system on said mask and a coordinate system on said substrate stage based on said information with respect to said positions.

119. A scanning exposure apparatus which transfers a pattern of a mask within an illumination area formed in a predetermined shape onto a substrate by illuminating said illumination area formed in said predetermined shape with a predetermined energy beam, the apparatus comprising:

a mask stage which holds said mask;

a substrate stage which holds said substrate; and a controller, connected to said mask stage and said substrate stage, which provides relative movement between a plurality of measuring marks provided on said mask and a reference mark provided, in correspondence with a part of said measuring marks, on said stage, to obtain information with respect to positions of said measuring marks and said reference mark, and which obtains a hypothetical coordinate system on said mask based on a coordinate system on said mask and said information with respect to said positions, and which obtains a writing error of said measuring marks based on said hypothetical coordinate system.

* * * * *